(12) United States Patent
Son et al.

(10) Patent No.: US 9,799,672 B2
(45) Date of Patent: Oct. 24, 2017

(54) MEMORY DEVICE HAVING CELL OVER PERIPHERY (COP) STRUCTURE, MEMORY PACKAGE AND METHOD OF MANUFACTURING THE SAME

(71) Applicants: Jae-Ick Son, Hwaseong-si (KR); Sung-Hoon Kim, Seongnam-si (KR)

(72) Inventors: Jae-Ick Son, Hwaseong-si (KR); Sung-Hoon Kim, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/015,120

(22) Filed: Feb. 3, 2016

(65) Prior Publication Data
US 2016/0307910 A1 Oct. 20, 2016

(30) Foreign Application Priority Data

Apr. 15, 2015 (KR) .................. 10-2015-0053163

(51) Int. Cl.
| | |
|---|---|
| H01L 29/40 | (2006.01) |
| H01L 21/44 | (2006.01) |
| H01L 27/11582 | (2017.01) |
| H01L 27/11573 | (2017.01) |
| H01L 27/11529 | (2017.01) |
| H01L 27/11524 | (2017.01) |
| H01L 27/1157 | (2017.01) |
| H01L 27/06 | (2006.01) |
| H01L 27/11565 | (2017.01) |

(52) U.S. Cl.
CPC .... *H01L 27/11582* (2013.01); *H01L 27/0688* (2013.01); *H01L 27/1157* (2013.01); *H01L 27/11524* (2013.01); *H01L 27/11529* (2013.01); *H01L 27/11565* (2013.01); *H01L 27/11573* (2013.01)

(58) Field of Classification Search
CPC .................................................. H01L 27/11529
USPC .................. 257/621, 698, 774; 438/667, 675
See application file for complete search history.

(56) References Cited

U.S. PATENT DOCUMENTS

| | | | |
|---|---|---|---|
| 8,097,964 B2 | 1/2012 | West et al. | |
| 8,203,213 B2 | 6/2012 | Lee et al. | |

(Continued)

FOREIGN PATENT DOCUMENTS

| | | |
|---|---|---|
| KR | 20100123140 | 11/2010 |
| KR | 101137688 | 4/2012 |

(Continued)

*Primary Examiner* — Calvin Lee
(74) *Attorney, Agent, or Firm* — Renaissance IP Law Group LLP

(57) ABSTRACT

A memory device includes a semiconductor substrate, a peripheral circuit formed on a top surface of the semiconductor substrate, a lower insulation layer covering the peripheral circuit, a base layer formed on the lower insulation layer, a memory cell array formed on the base layer, an upper insulation layer covering the memory cell array and a plurality of input-output pads formed on a bottom surface of the semiconductor substrate. At least one of the input-output pads is disposed to be overlapped with a portion of the memory cell array in a vertical direction. The sizes of the memory device and the memory package including the memory device may be reduced through the COP structure and efficient arrangement of the input-output pads.

13 Claims, 21 Drawing Sheets

(56) References Cited

U.S. PATENT DOCUMENTS

| | | | |
|---|---|---|---|
| 8,294,261 B2 | 10/2012 | Mawatari et al. | |
| 8,298,941 B2 * | 10/2012 | Yamaguchi | H01L 21/76898 |
| | | | 438/667 |
| 8,415,197 B2 * | 4/2013 | Choi | H01L 27/0207 |
| | | | 257/2 |
| 8,552,563 B2 | 10/2013 | Law et al. | |
| 8,637,364 B2 * | 1/2014 | Ueda | H01L 27/10817 |
| | | | 438/239 |
| 8,643,167 B2 | 2/2014 | Hung et al. | |
| 9,431,415 B2 * | 8/2016 | Shin | H01L 27/11578 |
| | | | 257/66 |
| 9,484,354 B2 * | 11/2016 | Lee | H01L 27/11573 |
| | | | 257/255 |
| 2011/0001249 A1 | 1/2011 | Law et al. | |
| 2011/0084365 A1 | 4/2011 | Law et al. | |
| 2015/0270250 A1 * | 9/2015 | Takamitsu | H01L 23/5384 |
| | | | 257/48 |

FOREIGN PATENT DOCUMENTS

| | | |
|---|---|---|
| KR | 101163891 | 7/2012 |
| KR | 20140058802 | 5/2014 |
| KR | 20140134226 | 11/2014 |

* cited by examiner

FIG. 1
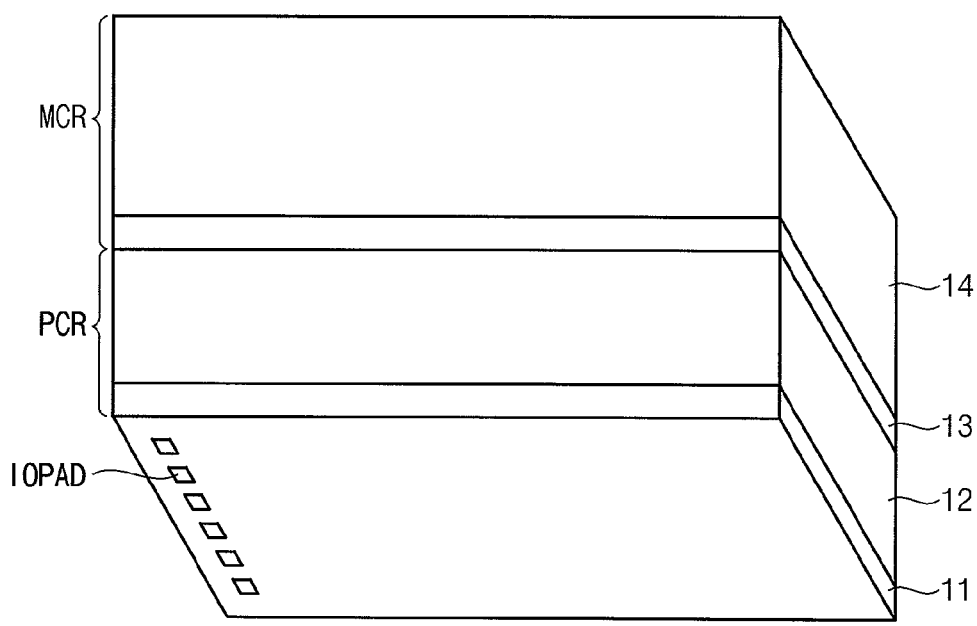
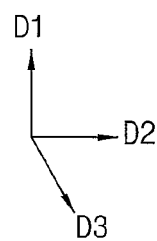

FIG. 15
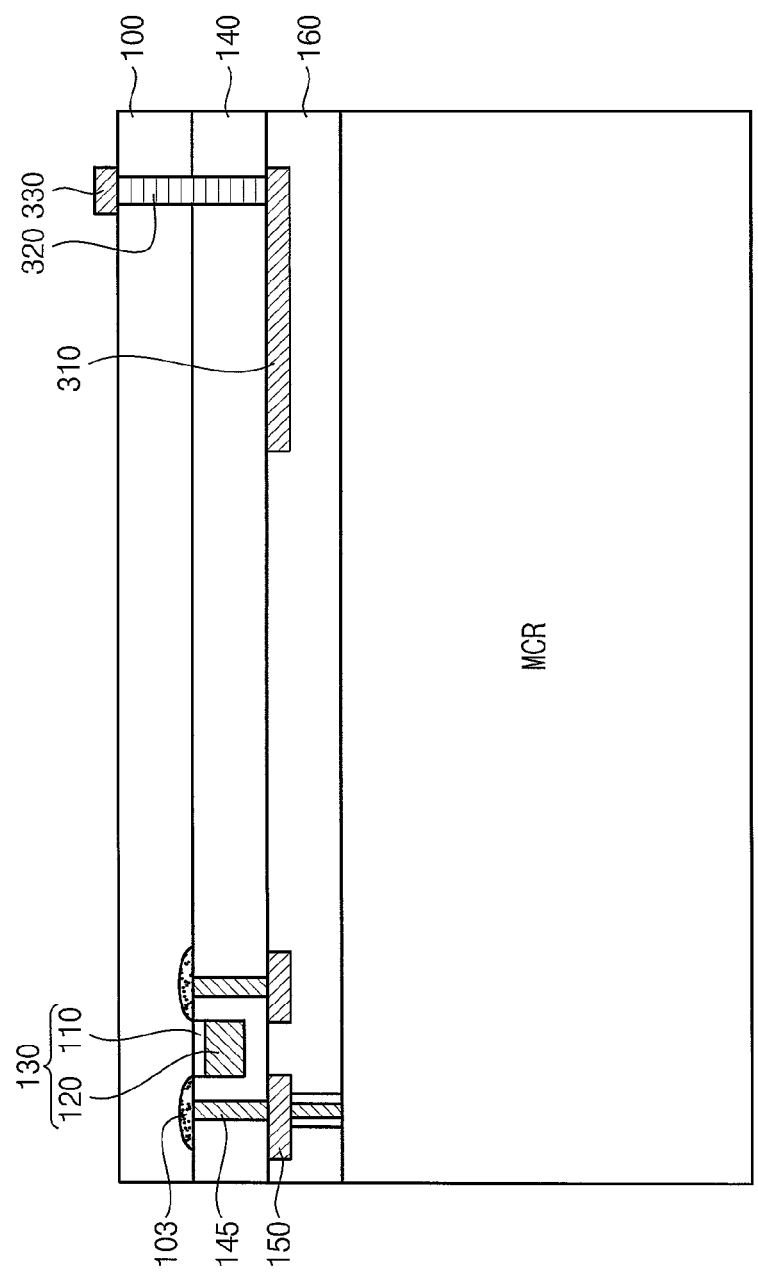
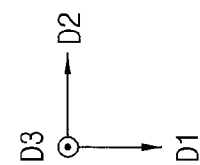

MEMORY DEVICE HAVING CELL OVER PERIPHERY (COP) STRUCTURE, MEMORY PACKAGE AND METHOD OF MANUFACTURING THE SAME

CROSS-REFERENCE TO RELATED APPLICATION

This U.S. Non-provisional application claims priority under 35 USC §119 to Korean Patent Application No. 10-2015-0053163, filed on Apr. 15, 2015, in the Korean Intellectual Property Office (KIPO), the disclosure of which is incorporated by reference in its entirety herein.

BACKGROUND

1. Technical Field

Example embodiments relate generally to semiconductor integrated circuits, and more particularly to a memory device of cell over periphery (COP) structure and a method of manufacturing the memory device.

2. Discussion of the Related Art

Recently, a vertical memory device or a three-dimensional memory device including a plurality of memory cells stacked repeatedly with respect to a surface of a substrate has been developed in order to realize a high degree of integration. In the vertical memory device, a channel may protrude or may be extended vertically from the surface of the substrate, and gate lines and insulation layers surrounding the vertical channel may be repeatedly stacked.

Even though such vertical structure is adopted, a size reduction of the vertical memory device is limited due to an interface to electrically connect a peripheral circuit for driving a memory cell array to an external device.

SUMMARY

At least one example embodiment of the present disclosure may provide a memory device having an efficient interface with an external device.

At least one example embodiment of the present disclosure may provide a memory package including a memory device having an efficient interface with an external device.

At least one example embodiment of the present disclosure may provide a method of manufacturing a memory device having an efficient interface with an external device.

According to example embodiments, a memory device includes a semiconductor substrate, a peripheral circuit formed on a top surface of the semiconductor substrate, a lower insulation layer covering the peripheral circuit, a base layer formed on the lower insulation layer, a memory cell array formed on the base layer, an upper insulation layer covering the memory cell array and a plurality of input-output pads formed on a bottom surface of the semiconductor substrate. At least one of the input-output pads is disposed to be overlapped with a portion of the memory cell array in a vertical direction.

In an example embodiment, the plurality of input-output pads may be arranged near one side of the bottom surface of the semiconductor substrate.

In an example embodiment, the memory device may further include a plurality of through-substrate vias penetrating the semiconductor substrate and a portion of the lower insulation layer.

In an example embodiment, at least one of the through-substrate vias may are disposed to be overlapped with the portion of the memory cell array in the vertical direction.

In an example embodiment, the plurality of through-substrate vias may connect the plurality of input-output pads with a plurality of lower wiring patterns in the lower insulation layer.

In an example embodiment, the plurality of through-substrate vias may be formed using the plurality of lower wirings as an etch stop layer, after the plurality of lower wirings are formed.

In an example embodiment, the base layer may include polysilicon or single crystalline silicon.

In an example embodiment, the base layer may be divided into a plurality of base later patterns and each of the plurality of base layer patterns serves as a p-type well.

In an example embodiment, the memory cell array may include a plurality of vertical NAND flash memory cells.

In an example embodiment, the memory cell array may include a plurality of channels extending in the vertical direction and a plurality of gate lines surrounding outer sidewalls of the channels, where the gate lines are stacked in the vertical direction and spaced apart from each other.

According to example embodiments, a memory package includes a base substrate and a plurality of memory chips stacked on the base substrate. Each of the memory chips includes a semiconductor substrate, a peripheral circuit formed on a top surface of the semiconductor substrate, a lower insulation layer covering the peripheral circuit, a base layer formed on the lower insulation layer, a memory cell array formed on the base layer, an upper insulation layer covering the memory cell array and a plurality of input-output pads formed on a bottom surface of the semiconductor substrate. At least one of the input-output pads overlaps with a portion of the memory cell array in a vertical direction.

In an example embodiment, the plurality of memory chips may be stacked on the base substrate in an upside-down state such that the bottom surface of the semiconductor substrate of each memory chip may face upwards.

In an example embodiment, with respect to each memory chip, the plurality of input-output pads may be arranged near one side of the bottom surface of the semiconductor substrate.

In an example embodiment, the plurality of memory chips may be stacked in a step shape such that the plurality of input-output pads of each memory chip may be exposed.

In an example embodiment, the plurality of memory chips may be electrically connected to the base substrate through a plurality of bonding wires.

According to example embodiments, a method of manufacturing a memory device includes forming a peripheral circuit on a top surface of a semiconductor substrate, forming a lower insulation layer covering the peripheral circuit, forming a base layer on the lower insulation layer, forming a memory cell array on the base layer, forming an upper insulation layer covering the memory cell array and forming a plurality of input-output pads on a bottom surface of the semiconductor substrate such that at least one of the input-output pads may are disposed to be overlapped with a portion of the memory cell array in a vertical direction.

In an example embodiment, the method may further include forming a plurality of through-substrate vias penetrating the semiconductor substrate and a portion of the lower insulation layer to connect the plurality of input-output pads with a plurality of lower wiring patterns in the lower insulation layer.

In an example embodiment, the plurality of through-substrate vias may be formed using the plurality of lower wirings as an etch stop layer, after the plurality of lower wirings are formed.

In an example embodiment, the plurality of input-output pads may be arranged near one side of the bottom surface of the semiconductor substrate.

In an example embodiment, the base layer may include polysilicon or single crystalline silicon.

The memory device, the memory package including the memory device and the method of manufacturing the memory device may reduce sizes of the memory device and the memory package by adopting the COP structure in which the peripheral circuit is formed on the semiconductor substrate and the memory cell array is stacked on the peripheral circuit.

The memory device, the memory package including the memory device and the method of manufacturing the memory device may reduce the sizes of the memory device and the memory package by forming the input-output pads that overlap with the memory cell region in the vertical direction.

BRIEF DESCRIPTION OF THE DRAWINGS

Example embodiments of the present disclosure will be more clearly understood from the following detailed description taken in conjunction with the accompanying drawings.

FIG. 1 is a perspective view of a memory device according to example embodiments.

FIGS. 9 through 15 are cross-sectional views for describing processes of manufacturing a memory device according to example embodiments.

DETAILED DESCRIPTION OF THE EMBODIMENTS

Figure 2:
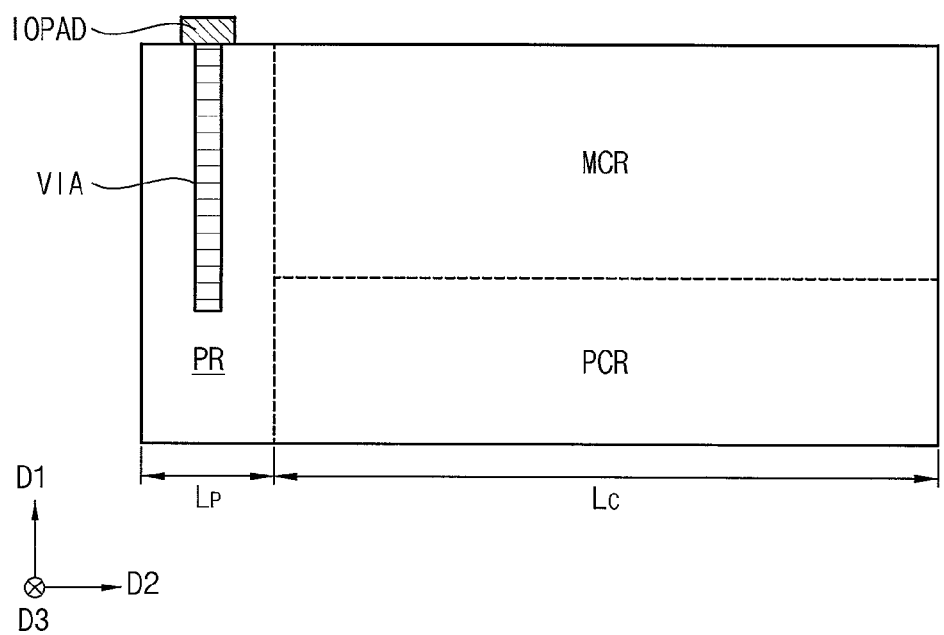
FIGS. 2 and 3 are diagrams for describing a size reduction effect of a memory device according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. Rather, these example embodiments are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a perspective view of a memory device according to example embodiments.

In FIG. 1, a direction substantially vertical to the top surface of the substrate is referred to as a first direction D1, and two directions substantially parallel to the top surface of the substrate and crossing each other are referred to as a second direction D2 and a third direction D3. For example, the second and third directions D2 and D3 may be perpendicular to each other. Additionally, a direction indicated by an arrow in the figures and a reverse direction thereof are considered as the same direction. The definition of the first, second and third directions D1, D2 and D3 are same in the figures cited in this disclosure.

Referring to FIG. 1, a memory device 10 include a peripheral circuit region PCR in which a peripheral circuit is formed, a memory cell region MCR in which a memory cell array is formed, and input-output pads IOPAD.

The peripheral circuit region PCR may include a semiconductor substrate 11, a peripheral circuit (not shown) formed on a top surface of the semiconductor substrate 11 and a lower insulation layer 12 covering the peripheral circuit. The memory cell region MCR may include a base layer 13 formed on the lower insulation layer 12, a memory cell array (not shown) formed on the base layer 13, an upper insulation layer 14 covering the memory cell array. The plurality of input-output pads IOPAD may be formed on a bottom surface of the semiconductor substrate 11. The plurality of input-output pads IOPAD may overlap with a portion of the memory cell region MCR in a vertical direction, that is, in the first direction D1. As will be described below, the input-output pads IOPAD may be formed to cover through-substrate vias that are formed in the peripheral circuit region PCR.

As such, the memory device 10 according to example embodiments may reduce a size of the memory device by adopting the cell over periphery (COP) structure in which the peripheral circuit is formed on the semiconductor substrate 11 and the memory cell array is stacked on the peripheral circuit. In addition, the memory device 10 may further reduce the size of the memory device by forming the input-output pads IOPAD such that the input-output pads IOPAD may overlap with the memory cell region MCR in the vertical direction D1.

Figure 3:
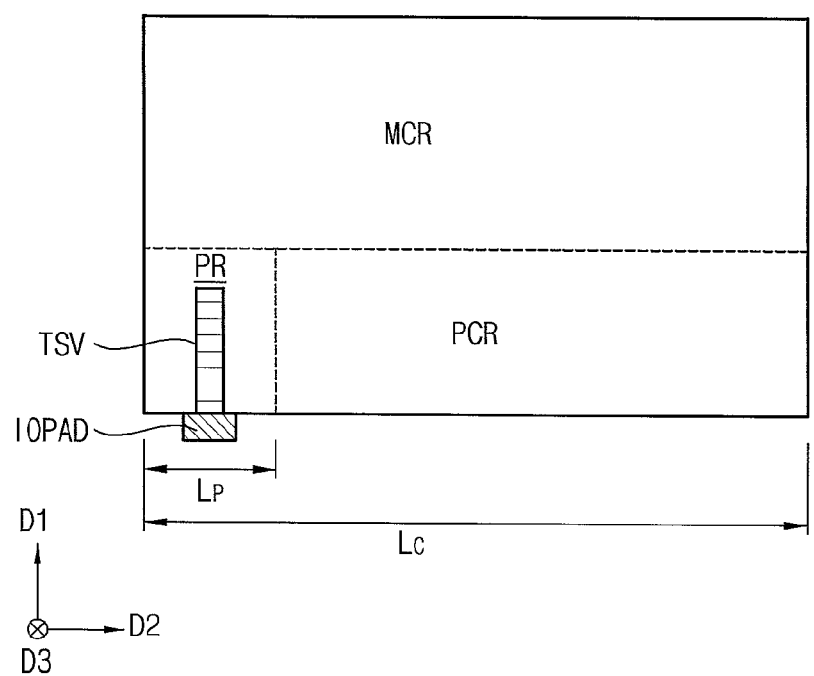

FIGS. 2 and 3 are diagrams for describing a size reduction effect of a memory device according to example embodiments.

Referring to FIG. 2, a pad region PR may be formed beside a memory cell region MCR in the second direction D2 in a memory device or a memory chip 20. The input-output pads IOPAD are formed on a top surface of the memory chip 20 and the vias VIA are formed beneath the input-output pads IOPAD to connect the input-output pads IOPAD to the peripheral circuit formed in the peripheral circuit region PCR. In this case, the length of the memory device 20 in the second direction D2 is Lp+Lc.

In the flash memory device, the area of the memory cell array exceeds 50% of the entire area. In the COP structure in which the memory cell array is disposed on the peripheral circuit, the lower space has a margin even though all elements except the memory cell array are disposed in the lower space. Accordingly the core circuit such as the row decoder, the column decoder, etc. may be disposed in the peripheral circuit region PCR along with the peripheral circuit. However, the input-output pads IOPAD have to be disposed on the top surface of the memory chip 20 for a wafer test and a package formation, and thus the size of the memory chip 20 may be increased due to the pad region PR.

Referring to FIG. 3, a pad region PR may overlap with a memory cell region MCR in the vertical direction D1, in a memory device or a memory chip 10 according to example embodiments. The input-output pads IOPAD are formed on a bottom surface of the memory chip 10 and the through-substrate vias TSV are formed on the input-output pads IOPAD to connect the input-output pads IOPAD to the peripheral circuit formed in the peripheral circuit region PCR. In this case, the length of the memory device 10 in the second direction D2 is Lc.

The memory device 10 may further reduce the size of the memory device forming the input-output pads IOPAD such that the input-output pads IOPAD may overlap with the memory cell region MCR in the vertical direction D1.

Figure 4:
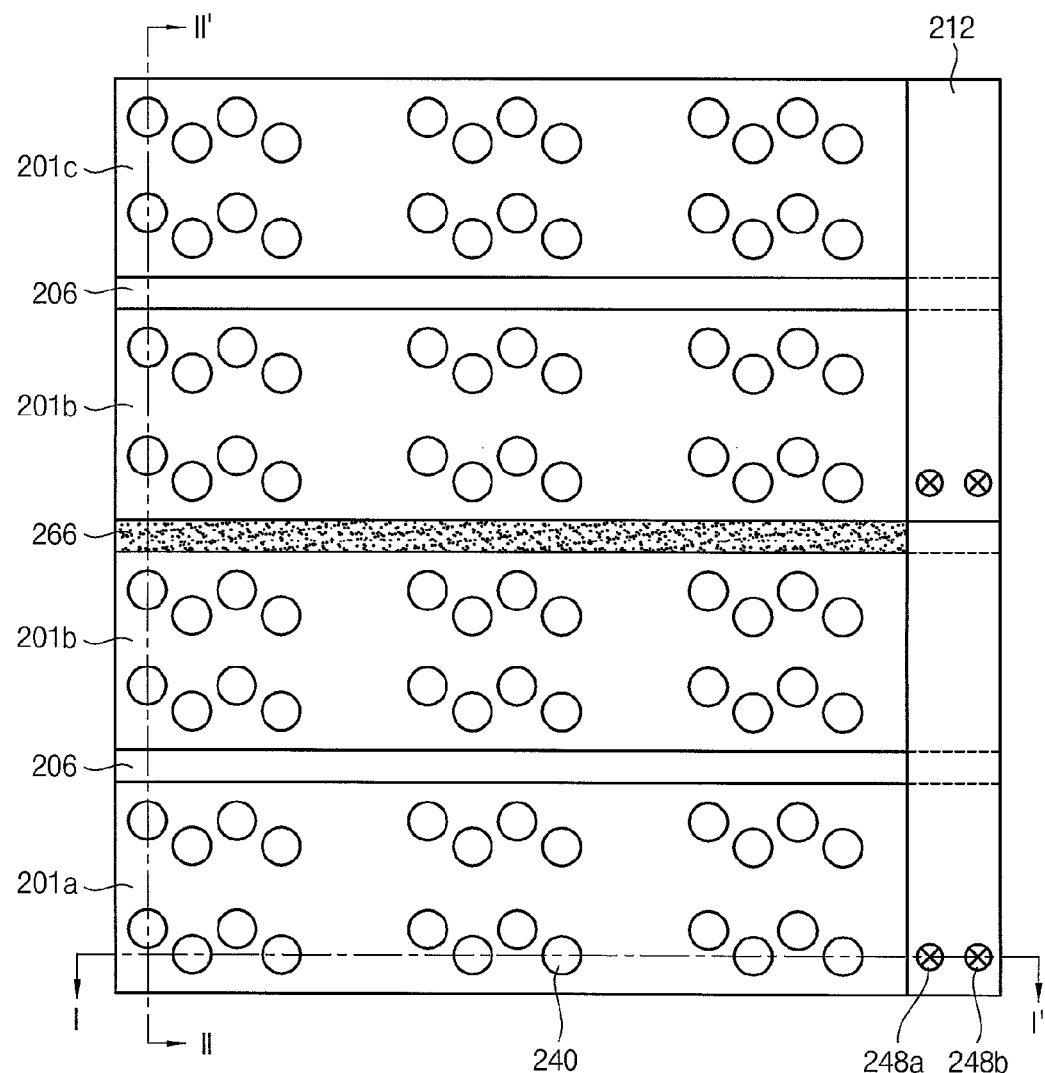
FIGS. 4 and 5 are top and bottom views of a memory device according to example embodiments.
Figure 5:
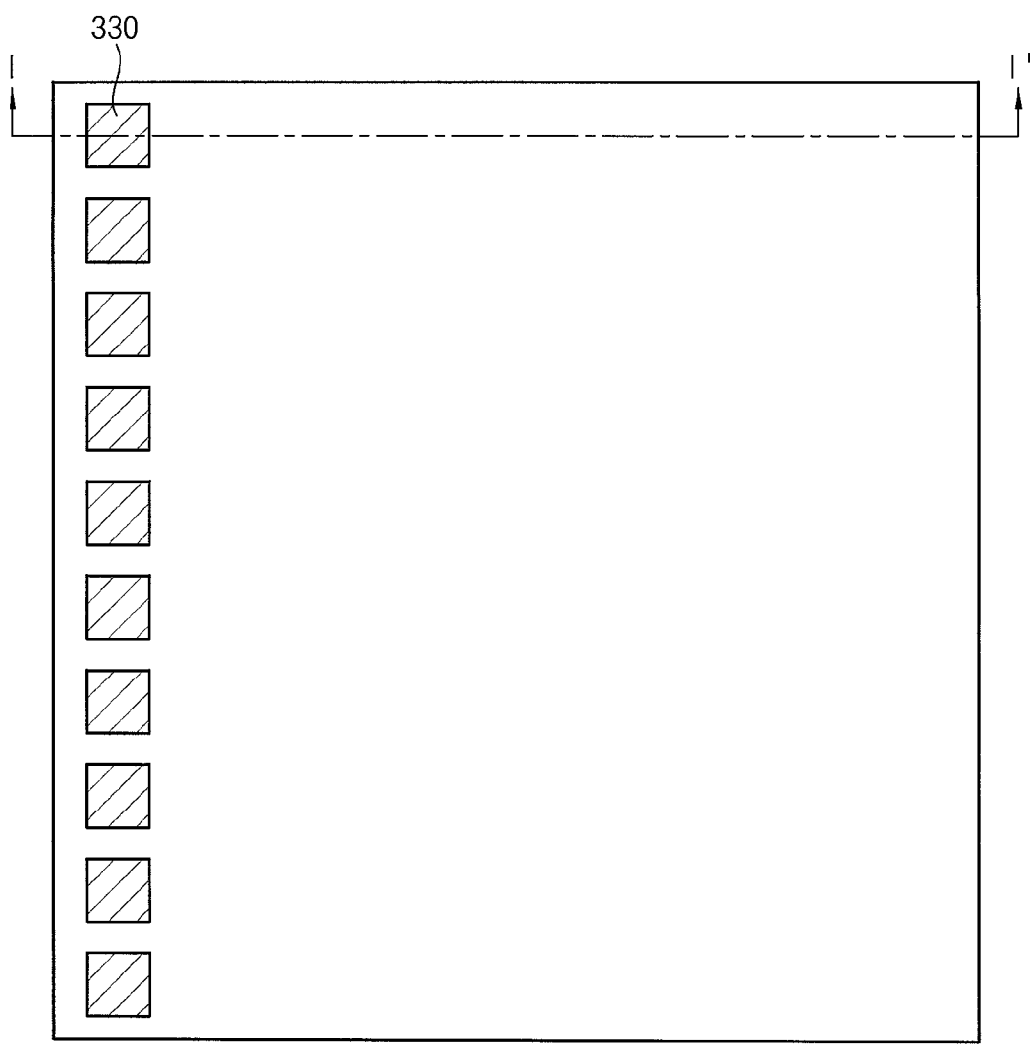
Figure 6:
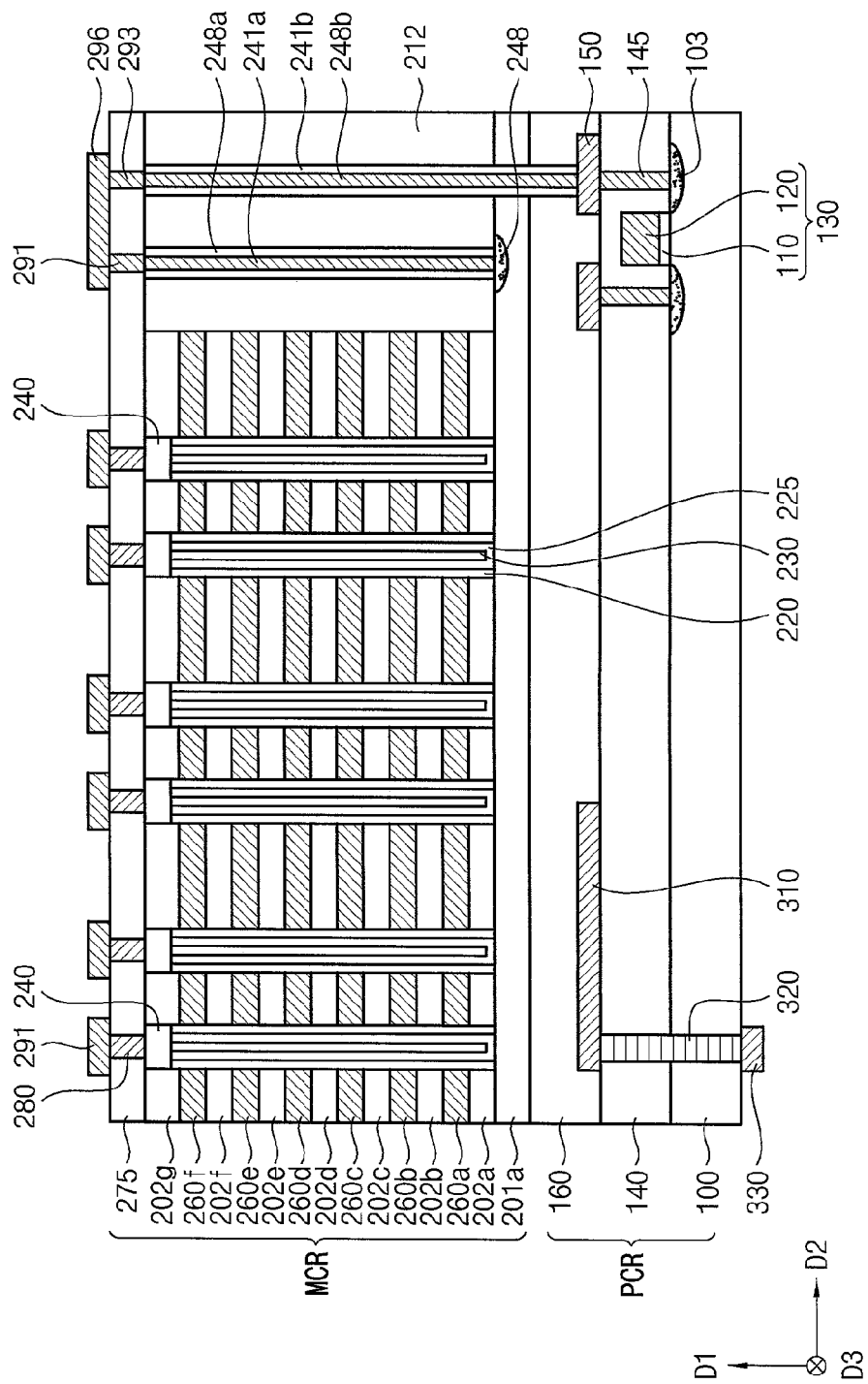
FIGS. 6 and 7 are cross-sectional views taken along lines I-I' and II-II' of FIG. 4, respectively.
Figure 7:
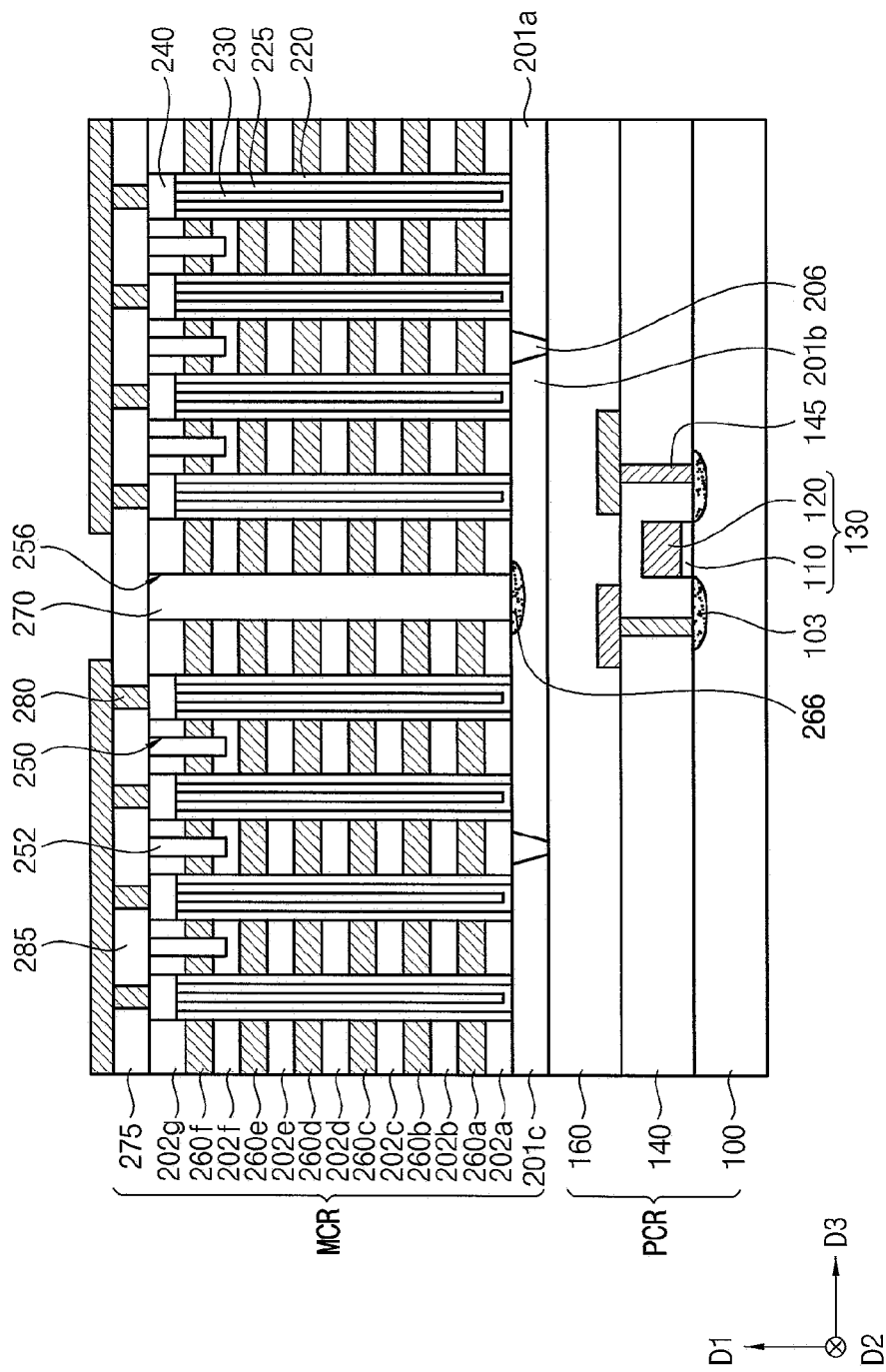

FIGS. 4 and 5 are top and bottom views of a memory device according to example embodiments respectively, and FIGS. 6 and 7 are cross-sectional views taken along lines I-I' and II-II' of FIG. 4, respectively;

In example embodiments, the device may be a non-volatile memory device. For example, the device may have a cell over periphery (COP) structure in which a memory cell structure is stacked on a peripheral circuit. The memory cell structure may have a vertical NAND flash memory device structure in which a plurality of NAND flash memory cells are formed vertically, that is, in the first direction D1, with respect to a top surface of a substrate.

For clear and concise description, some elements of the memory device are not shown in FIG. 4. For example, FIG. 4 illustrates base layer patterns 201a, 201b and 201c, separation layer patterns 206, a second impurity region 266, pads 240, a mold protection layer 212, a first connecting contact 248a and a second connecting contact 248b, and the other elements than described above are omitted.

Referring to FIGS. 4 to 7, the memory device may include a peripheral circuit region PCR including a peripheral circuit structure and a memory cell region MCR including a memory cell structure.

The peripheral circuit structure may include, e.g., a transistor including a gate structure 130 and a source/drain region 103 formed on a substrate 100, lower insulation layers 140 and 160, a lower contact 145, and lower wirings 150 and 310.

The substrate 100 may include a semiconductor material, e.g., single crystalline silicon or a single crystalline germanium. The gate structure 130 may include a gate insulation layer pattern 110 and a gate electrode 120, which are stacked on the substrate 100. The transistor may be disposed and defined on the substrate 100.

The gate insulation layer pattern 110 may include, e.g., silicon oxide or a metal oxide. The gate electrode 120 may include, e.g., a metal, a metal nitride or doped polysilicon. The source/drain region 103 may include n-type or p-type impurities.

A first lower insulation layer 140 may be formed on the substrate 100 to cover the structure such as the transistor, and the lower contact 145 may extend through the first lower insulation layer 140 to be electrically connected to the source/drain region 103.

The lower wirings 150 and 310 may be disposed on the first lower insulation layer 140 and may be electrically connected to the lower contact 145 and the through-substrate via 145 respectively. A second lower insulation layer 160 may be formed on the first lower insulation layer 140 to cover the lower wirings 150 and 310. FIG. 6 illustrates a non-limiting example that the lower wirings 150 and 310 are formed in the same layer, but the lower wirings may be distributed in different wiring layers.

The first and second lower insulation layers 140 and 160 may include an insulating material, e.g., silicon oxide. The lower contact 145 and the lower wirings 150 and 310 may include, e.g., a metal, a metal nitride or doped polysilicon.

The memory cell structure may include first to third base layer patterns 201a, 201b and 201c, a channel 225, the gate line 260, a bit line 285 and a connecting wiring 296, etc.

The separation layer pattern 206 may be extended in the second direction D2, and a plurality of the separation layer patterns 206 may be arranged along the third direction D3. Thus, a base layer may be physically divided into the first to third base layer patterns 201a, 201b and 201c. FIGS. 4 to 7 illustrate three base layer patterns 201a, 201b and 201c, however, the number of the base layer patterns is not be specifically limited herein.

The base layer patterns 201a, 201b and 201c may include polysilicon or single crystalline silicon. In some embodiments, the base layer patterns 201a, 201b and 201c may further include p-type impurities such as boron (B). In this case, the base layer patterns 201a, 201b and 201c may serve as a p-type well.

The separation layer pattern 206 may be extended linearly in the second direction D2. The base layer patterns 201a, 201b and 201c may be physically separated by the separation layer pattern 206. The separation layer pattern 206 may include an insulation layer pattern, e.g., silicon oxide.

The channel 225 may be disposed on the base layer patterns 201a, 201b and 201c, and may extend in the first direction D1 from top surfaces of the base layer patterns 201a, 201b and 201c. The channel 225 may have a hollow cylindrical shape or a cup shape. The channel 225 may include polysilicon or single crystalline silicon, and may include an impurity region doped with, e.g. p-type impurities such as boron.

A plurality of the channels 225 may be arranged in the second direction D2 to form a channel row, and a plurality of the channel rows may be arranged in the third direction D3. In some example embodiments, the channels 225 included in the neighboring channel rows may be arranged in a zigzag arrangement to face each other. Thus, a density of the channels 225 in a unit area of the base layer pattern 201a, 201b and 201c may be increased.

A filling layer pattern 230 may be formed in an inner space of the channel 225. The filling layer pattern 230 may have a pillar shape or a solid cylindrical shape. The filling layer pattern 230 may include an insulation layer pattern, e.g., silicon oxide.

According to an embodiment, the channel 225 may have a pillar shape or a solid cylindrical shape. In the embodiment, the filling layer pattern 230 may be omitted.

A dielectric layer structure 220 may be formed on an outer sidewall of the channel 225. The dielectric layer structure 220 may have a cup shape of which a central bottom is opened, or a straw shape.

The dielectric layer structure 220 may include a tunnel insulation layer, a charge storage layer and a blocking layer which may be sequentially stacked from the outer sidewall of the channel 225. The blocking layer may include silicon oxide or a metal oxide such as hafnium oxide or aluminum oxide. The charge storage layer may include a nitride such as silicon nitride or a metal oxide, and the tunnel insulation layer may include an oxide such as silicon oxide. For example, the dielectric layer structure 220 may have an oxide-nitride-oxide (ONO) layers-stacked structure.

The pad 240 may be formed on the filling layer pattern 230, the channel 225 and the dielectric layer structure 220. For example, the filling layer pattern 230, the channel 225 and the dielectric layer structure 220 may be capped or closed by the pad 240. The pad 240 may include a polysilicon or single crystalline silicon. The pad 240 may further include n-type impurities, for example, phosphorus (P) or arsenic (As).

As illustrated in FIG. 4, a plurality of the pads 240 may be arranged in the second direction D2 to form a pad row substantially comparable to the channel row. A plurality of the pad rows may be arranged in the third direction D3.

The gate lines 260 (e.g., 260a through 260f) may be disposed on an outer sidewall of the dielectric layer structure 220 and may be spaced apart from each other in the first direction. In example embodiments, each gate line 260 may surround the channels 225 of at least one channel row and may be extended to the second direction.

For example, as illustrated in FIGS. 4 to 7, each gate line 260 may surround six channel rows, however, the number of the channel rows surrounded by each gate line 260 is not specifically limited.

The gate line 260 may include a metal having a low electrical resistance and/or a nitride thereof. For example, the gate line 260 may include tungsten (W), tungsten nitride, titanium (Ti), titanium nitride, tantalum (Ta), tantalum nitride, platinum (Pt), or the like. In some embodiments, the gate line 260 may have a multi-layered structure including a barrier layer formed of a metal nitride and a metal layer.

For example, a lowermost gate line 260a may serve as a ground selection line (GSL). Four gate lines 260b, 260c, 260d and 260e on the GSL may serve as word lines. An uppermost gate line 260f on the word lines may serve as a string selection line (SSL).

In this case, the GSL, the word lines, and the SSL may be formed at a single level, four levels and a single level, respectively. However, each the number of levels of the GSL, the word line and the SSL is not specifically limited. According to some embodiments, the GSL and the SSL may be formed at two levels, respectively, and the word line may be formed at $2^n$ levels such as 4, 8 or 16 levels. The stacked number of the gate lines 260 may be determined in consideration of a circuit design and a degree of integration of the semiconductor device.

Insulating interlayers 202 (e.g., 202a to 202g) may be disposed between the gate lines 260 neighboring along the first direction D1. The insulating interlayers 202 may include a silicon oxide based material, e.g., silicon dioxide ($SiO_2$), silicon oxycarbide (SiOC) or silicon oxyfluoride (SiOF). The gate lines 260 may be insulated from each other along the first direction D1 by the insulating interlayers 202.

The gate line cut region 256 may be formed through the gate lines 260 and the insulating interlayers 202 along the first direction D1. The gate line cut region 256 may have a trench shape or a ditch shape extending in the second direction D2.

A gate line cut pattern 270 extending in the second direction D2 may be disposed on the second impurity region 266. A plurality of the second impurity regions 266 and the gate line cut patterns 270 may be arranged along the third direction D3. In some embodiments, the second impurity region 266 may include n-type impurities, for example, phosphorus (P) or arsenic (As). The gate line cut pattern 270 may include an insulation layer pattern, e.g., silicon oxide. A metal silicide pattern (not illustrated) such as a cobalt silicide pattern and/or a nickel silicide pattern may be further formed on the second impurity region 266.

In some example embodiments, a cell block sharing the gate lines 260 may be defined by the gate line cut pattern 270. The cell block may be divided into sub-cell blocks by the separation layer pattern 206. Thus, a dimension or a size of an individual block may be reduced, so that a segmented operational control may be achieved, In some embodiments, one of the second impurity regions 266 and one of the gate line cut patterns 270 may be provided per each base layer pattern 201a, 201b and 201c. As illustrated in FIG. 7, for example, the second impurity region 266 may be formed at a central region of the second base layer pattern 201b, and the gate line cut pattern 270 may be disposed on the second impurity region 266.

A connecting contact and a connecting wiring may be provided per each base layer pattern 201a, 201b and 201c to transfer an electrical signal and/or a voltage from a peripheral circuit.

In example embodiments, the mold protection layer 212 may be formed on lateral portions of the base layer pattern 201a, 201b and 201c, and the separation layer pattern 206. The first connecting contact 248a may extend through the mold protection layer 212 to make contact with a first impurity region 248 formed at the lateral portion of the base layer pattern 201a, 201b and 201c. The second contact 248b may extend through the mold protection layer 212, the base layer pattern 201a, 201b and 201c, and a second lower insulation layer 160 to make contact with a lower wiring 150. A first insulation layer pattern 241a and a second insulation layer pattern 241b may be formed on sidewalls of the first connecting contact 248a and the second connecting contact 248b, respectively.

A first plug 291 and a second plug 293 may extend through an upper insulation layer 275 to be in contact with the first connecting contact 248a and the second connecting contact 248b, respectively. The connecting wiring 296 may be disposed on the upper insulation layer to electrically connect the first and second plugs 291 and 293, respectively.

An upper gate line cut pattern 252 may be formed in the upper gate line cut region 250. The upper gate line cut pattern 252 may include an insulation material, e.g., silicon oxide.

In example embodiments, the upper gate line cut region 250 or the upper gate line cut pattern 252 may be provided for a separation of the SSL in each cell block. In this case, the upper gate line cut region 250 or the upper gate line cut pattern 252 may extend through an uppermost insulating interlayer 202g and the SSL 260f, and may extend partially through an insulating interlayer 202f directly under the SSL 260f.

An upper insulation layer 275 may be formed on the uppermost insulating interlayer 202g, the pad 240, the upper gate line cut pattern 252, the gate line cut pattern 270, the first connecting contact 244a and the second connecting contact 244b.

A bit line contact 280 may be formed through the upper insulation layer 275 to make contact with the pad 240. A plurality of the bit line contacts 280 may be formed to define an array comparable to an arrangement of the channels 225 or the pads 240.

The bit line 285 may be disposed on the upper insulation layer 275 to be electrically connected to the bit line contact 280. For example, the bit line 285 may extend in the third direction to be electrically connected to a plurality of the bit line contacts 280. The bit line 285 and the separation layer pattern 205 may extend in substantially the same direction.

According to example embodiments described above, the base layer may be physically separated by the separation layer pattern 206. Thus, the first to third base layer patterns 201a, 201b and 20c capable of being operated independently or individually may be obtained.

The cell block may be further segmented or divided by the separation layer pattern 206, and thus signal interference or disturbance due to the large size of cell block may be reduced. Thus, reliability of the semiconductor device may be improved.

As illustrated in FIGS. 5 and 6, the input-output pads 330 may be arranged near one side of the bottom surface of the semiconductor substrate 100. A plurality of through-substrate vias 320 may be formed such that the through-substrate vias 320 may penetrate the semiconductor substrate 100 and a portion 140 of the lower insulation layer 140 and 160. The through-substrate vias 320 may connect the input-output pads 330 with a plurality of lower wiring patterns 310 in the lower insulation layer 140 and 160. The through-substrate vias may overlap with the portion of the memory cell array in the vertical direction D1. As such, the size of the memory device may be further reduced by forming the input-output pads 330 such that the input-output pads 330 may overlap with the memory cell region MCR in the vertical direction D1.

Figure 8:
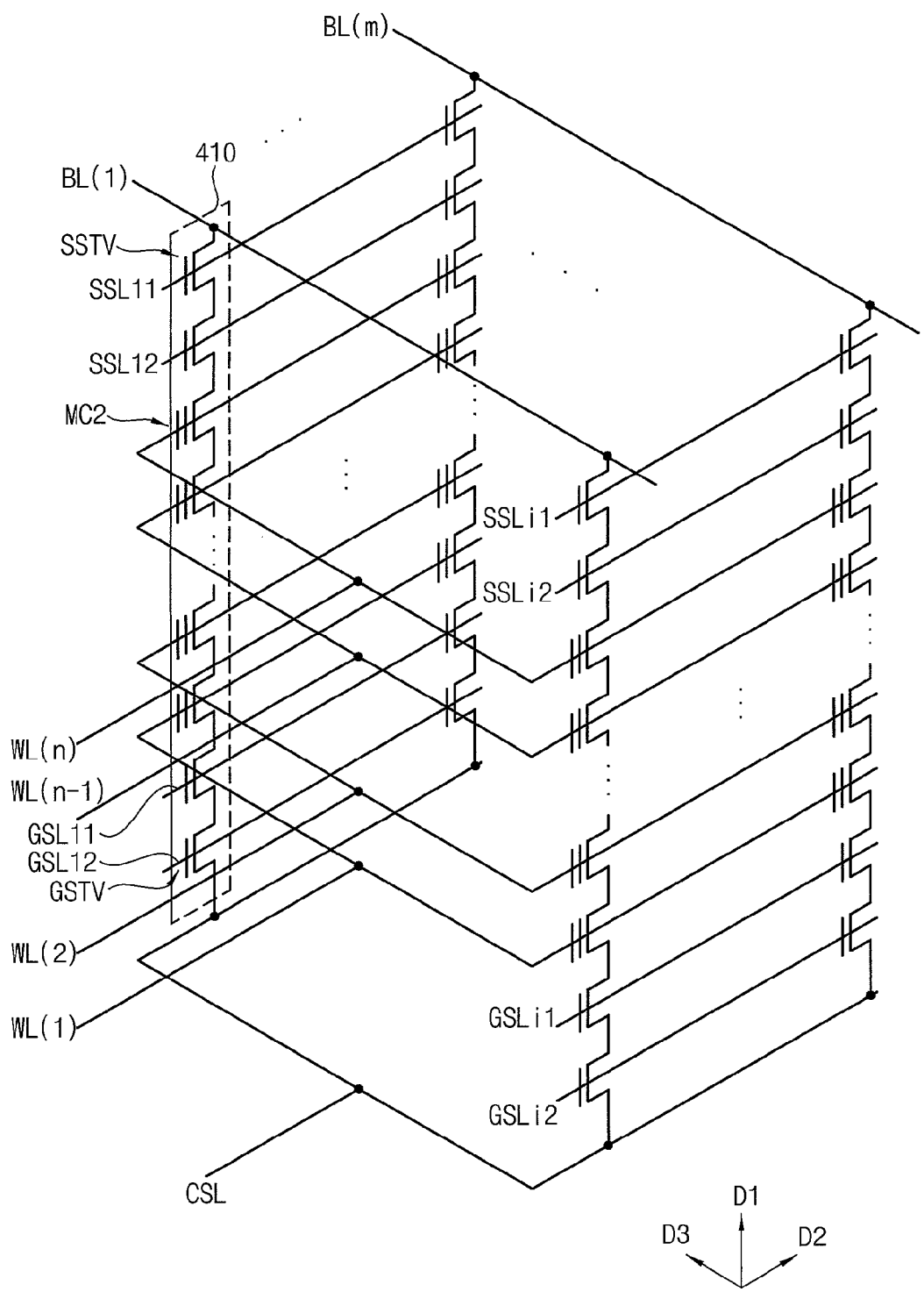
FIG. 8 is a circuit diagram illustrating an example of a memory cell array that may be formed in a memory cell region in FIG. 6.

FIG. 8 is a circuit diagram illustrating an example of a memory cell array that may be formed in a memory cell region in FIG. 6.

Referring to FIG. 8, a memory cell array 400 may include a plurality of strings 410 each of which has a vertical structure. The plurality of strings 400 may be formed in a second direction D2 to define a string column, and a plurality of string columns may be formed in a third direction D3 to define a string array. Each string may include string select transistors SSTV, ground select transistors GSTV, and a plurality of memory cells MC2 that are formed in a first direction D1 and are connected in series between the string select transistors SSTV and the ground select transistors GSTV.

The string select transistors SSTV may be connected to bit-lines BL(1), . . . , BL(m), and the ground select transistors GST may be connected to a common source line CSL. The string select transistors SSTV may be connected to string select lines SSL11, SSL12, . . . , SSLi1, SSLi2, and the ground select transistors GSTV may be connected to ground select lines GSL11, GSL12, . . . , GSLi1, GSLi2. The memory cells in the same layer may be connected to the same word-line among word-lines WL(1), WL(2), . . . WL(n−1), WL(n). Each string select line and each ground select line may extend in the second direction D2, and the string select lines SSL11, . . . , SSLi2 and the ground select lines GSL11, . . . , GSLi2 may be formed in the third direction D3. Each word-line may extend in the second direction D2, and the word-lines WL(1), . . . , WL(n) may be formed in the first direction D1 and the third direction D3. Each bit-line may extend in the third direction D3, and the bit-lines BL(1), . . . , BL(m) may be formed in the second direction D2. The memory cells MC2 may be controlled by a voltage on the word-lines WL(1), . . . , WL(n).

As with the two-dimensional flash memory device, the vertical or three-dimensional flash memory device includes the memory cell array 400, a read operation and may perform a per page program operation and per block erase operation.

Although not illustrated in FIG. 8, according to embodiments, two string select transistors included in a single string may be connected to a single string select line, and two ground select transistors included in the single string may be connected to a single ground select line. According to embodiments, the single string may include one string select transistor and one ground select transistor.

FIGS. 9 through 15 are cross-sectional views for describing processes of manufacturing a memory device according to example embodiments. For clear and concise description, manufacturing processes of some elements in FIGS. 4 to 7 may not be illustrated.

Figure 9:
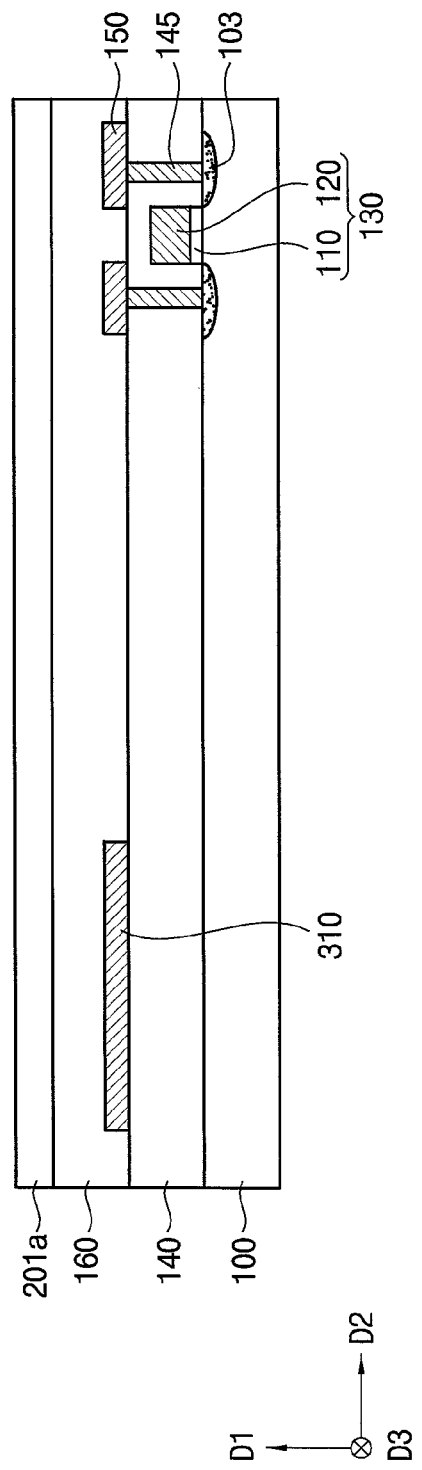

Referring to FIG. 9, a gate structure 130 and source/drain regions 103 may be formed on a substrate 100.

A semiconductor substrate including single crystalline silicon and/or single crystalline germanium may be used as the substrate 100. For example, the substrate 100 may be obtained from a silicon wafer.

A gate insulation layer and a gate electrode layer may be formed on the substrate 100, and then may be etched to form a gate insulation layer pattern 110 and a gate electrode 120. Thus, the gate structure 130 including the gate insulation layer pattern 110 and the gate electrode 120 sequentially stacked on the substrate 100 may be formed.

An ion-implantation process may be performed using the gate structure 130 as an implantation mask to form the source/drain regions 103 at an upper portion of the substrate 100 adjacent to the gate structure 130. Accordingly, the source/drain regions 103 may be formed at the upper portions of the substrate 100 adjacent to the gate structure 130, and thus the transistor may be defined and formed on the substrate 100.

The gate insulation layer may be formed using silicon oxide or a metal oxide by a chemical vapor deposition (CVD) process, a plasma enhanced chemical vapor deposition (PECVD) process, a spin coating process, an atomic layer deposition (ALD) process, etc. Alternatively, the gate insulation layer may be formed by a thermal oxidation process on a top surface of the substrate 100. The gate electrode layer may be formed using a metal, a metal nitride or doped polysilicon by, e.g., an ALD process or a sputtering process.

A first lower insulation layer 140 covering the gate structures 130 may be formed on the substrate 100. A lower contact 145 may be formed through the first lower insulation layer 140 to be in contact with the source/drain regions 103.

A lower wiring 150 electrically connected to the lower contact 145 and a lower wiring 310 to be electrically connected to the through-substrate via (not shown) may be formed on the first lower insulation layer 140.

A second lower insulation layer 160 covering the lower wirings 150 may be formed on the first lower insulation layer 140.

The first and second lower insulation layers 140 and 160 may be formed using an insulating material, e.g., silicon oxide by, e.g., a CVD process or a spin coating process. The lower contact 145 and the lower wirings 150 and 310 may be formed using a metal or a metal nitride by, e.g., an ALD process or a sputtering process.

Figure 10:
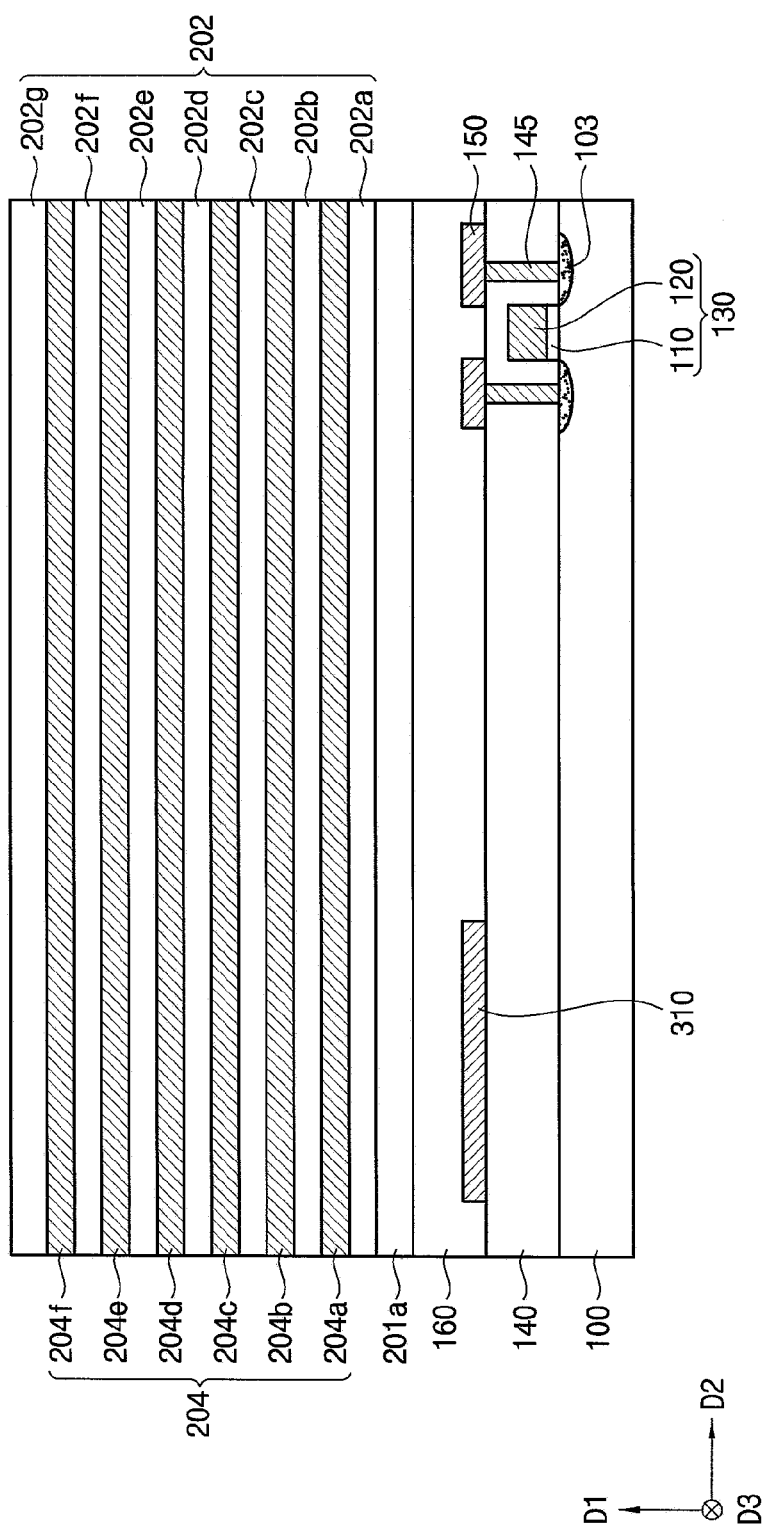

A single-leveled lower wiring is illustrated in FIG. 10, however, additional lower insulation layers and lower wirings may be stacked.

A base layer may be formed on the second lower insulation layer 160. A separation layer pattern 206 may be formed such that the base layer may be patterned to, e.g., first to third base layer patterns 201a, 201b and 201c physically separated from each other.

In some embodiments, the base layer may be formed using polysilicon by a sputtering process, a CVD process, an ALD process, a physical vapor deposition (PVD) process, etc. The base layer may be formed using polysilicon doped with, e.g., p-type impurities. In this case, the base layer may serve as a p-type well.

In some embodiments, an amorphous silicon layer may be formed on the second lower insulation layer 160, and then a thermal treatment or a laser irradiation may be performed to transform the amorphous silicon layer into the base layer including single crystalline silicon. In this case, defects in the base layer may be cured so that a functional characteristic of the base layer as the p-type well may be enhanced.

According to some embodiments, the base layer may be formed by a wafer bonding process. In this case, a wafer (e.g., a single crystalline silicon wafer) may be attached on the second lower insulation layer 160. An upper portion of the wafer may be removed or planarized to form the base layer.

Referring to FIGS. 6, 7 and 10, insulating interlayers 202 (e.g., 202a through 202g) and sacrificial layers (e.g., 204a through 204f) may be formed alternately and repeatedly on the base layer patterns 201a, 201b and 201c, and on the separation layer patterns 206 to form a mold structure.

In example embodiments, the insulating interlayer 202 may be formed using a silicon oxide based material, e.g., silicon dioxide, silicon oxycarbide and/or silicon oxyfluoride. The sacrificial layer 204 may be formed using a material that may have an etching selectivity with respect to the insulating interlayer 202 and may be easily removed by a wet etching process. For example, the sacrificial layer 204 may be formed using a silicon nitride and/or silicon boronitride (SiBN).

The insulating interlayer 202 and the sacrificial layer 204 may be formed by a CVD process, a PECVD process, a spin coating process, an ALD process, etc. A lowermost insulating interlayer 202a may be substantially integral or unitary with the separation layer pattern 206. In an embodiment, the formation of the separation layer may be omitted, and the lowermost insulating interlayer 202a may fill the opening corresponding to the separation layer pattern 206 and cover the base layer patterns 201a, 201b and 201c.

The sacrificial layers 204 may be removed in a subsequent process to provide spaces for a GSL, a word line and an SSL. For example, each of the GSL and the SSL may be formed at a single level, and the word line may be formed at 4 levels. In this case, the sacrificial layers 204 may be formed at 6 levels, and the insulating interlayers 202 may be formed at 7 levels as illustrated in FIG. 10. However, the stacked number of the GSL, the SSL and the word lines may not be limited to the examples provided herein.

Figure 11:
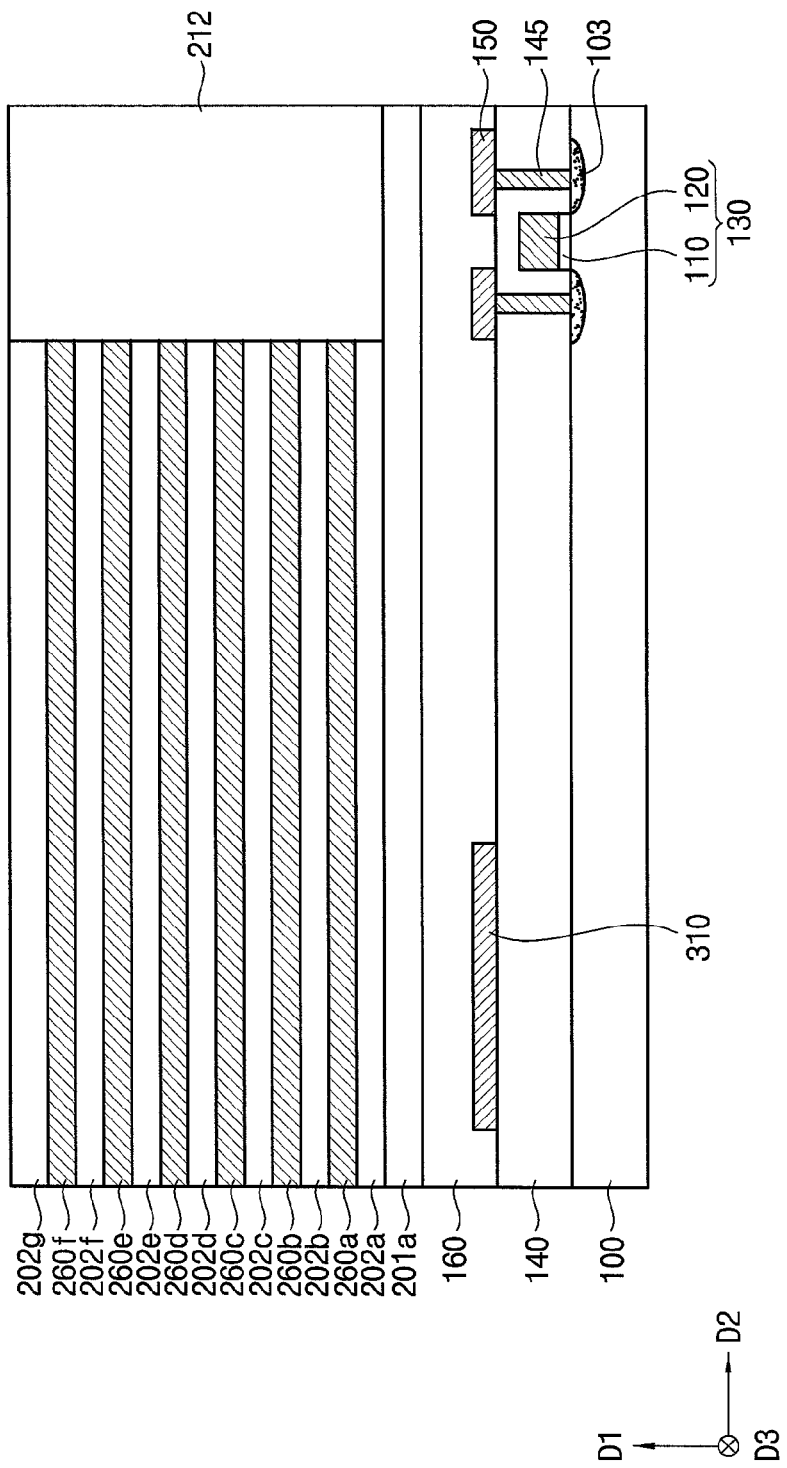

Referring to FIG. 11, a lateral portion of the mold structure may be removed, and an insulation layer covering the mold structure may be formed on the base layer patterns 201a, 201b and 201c, and the separation layer pattern 206. An upper portion of the insulation layer may be planarized until an uppermost insulating interlayer 202g is exposed to form a mold protection layer 212.

Figure 12:
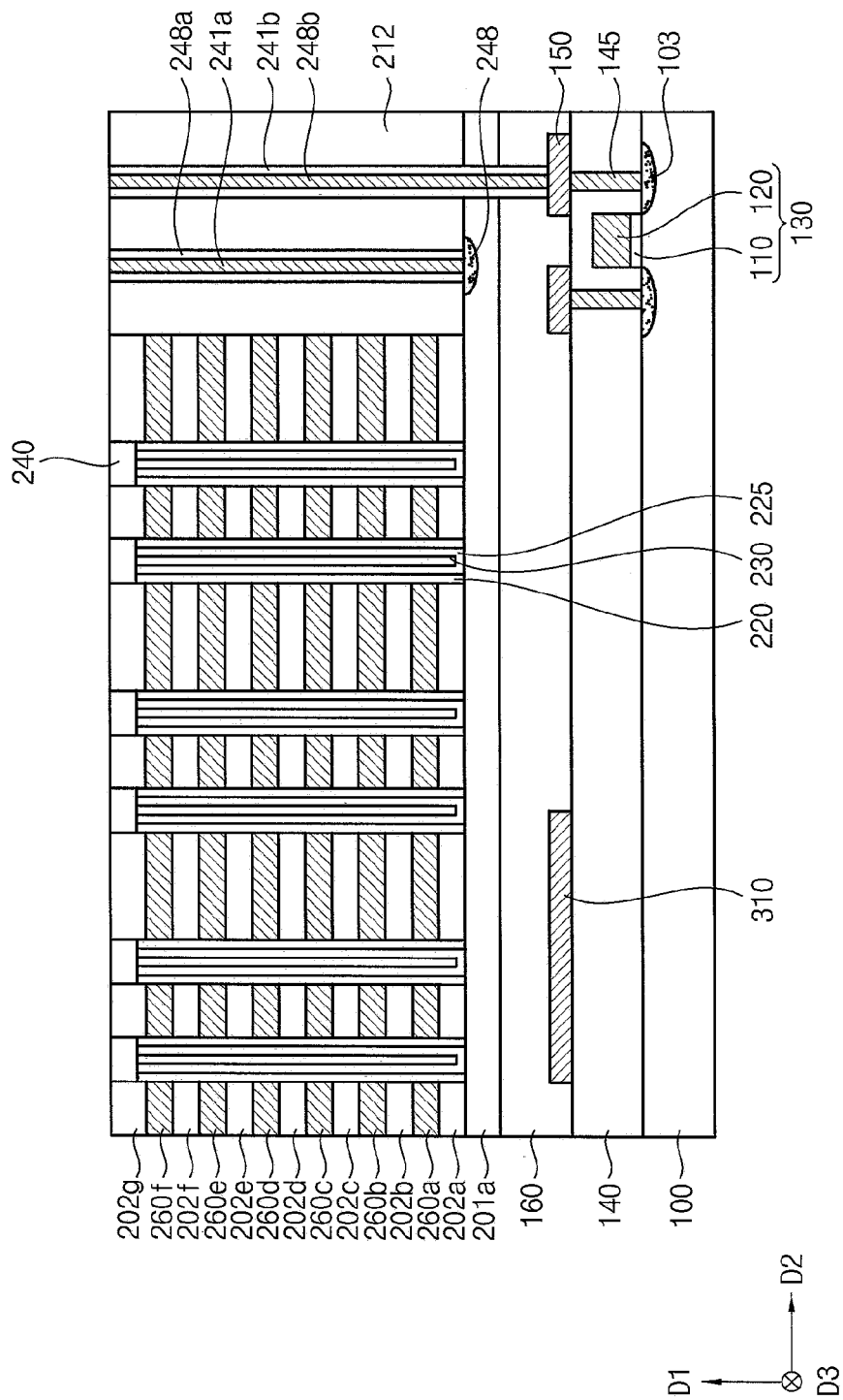

Referring to FIG. 12, channel holes may be formed through the mold structure, and a dielectric layer structure 220, a channel 225 and a filling layer pattern 230 may be formed in the channel hole. A pad 240 capping the channel hole may be formed on the dielectric layer structure 220, the channel 225 and the filling layer pattern 230.

A first connecting contact 248a and a second connecting contact 248b may be formed. For example, the mold protection layer 212 may be partially etched to form a first contact hole through which a top surface of the base layer pattern 201a, 201b and 201c is exposed. Impurities may be implanted through the first contact hole into an upper portion of the base layer pattern 201a, 201b and 201c to form a first impurity region 248. In addition, the mold protection layer 212, the base layer pattern 201a, 201b and 201c, and the second lower insulation layer 160 may be partially etched to form a second contact hole through which the lower wiring 150 of the peripheral circuit is exposed. First and second insulation layer patterns 241a and 241b may be formed on sidewalls of the first and second contact holes, respectively, and then the first and second connecting contacts 248a and 248b may be formed to fill remaining portions of the first and second contact holes.

A pair of the first and second connecting contacts 248a and 248b may be formed on each of the base layer patterns 201a, 201b and 201c.

The upper gate line cut pattern 252 and the gate line cut region 256 are formed as illustrated in FIGS. 6 and 7. The sacrificial layers 204 exposed by the gate line cut region 256 may be removed, and gate lines 260 may be formed at spaces from which the sacrificial layers 204 are removed. In example embodiments, the gate line cut region 256 may be formed at a central portion of each of the base layer patterns 201a, 201b and 201c.

The second impurity region 266 may extend in the second direction. The second impurity region may be formed on each of the base layer patterns 201a, 201b to serve as a CSL.

An upper insulation layer 275 may be formed on the uppermost insulating interlayer 202g, the upper gate line cut pattern 252, the gate line cut pattern 270, the pad 240, the first and second connecting contacts 248a and 248b. The upper insulation layer 275 may be formed using, e.g., silicon oxide by a CVD process.

A first plug 291 and a second plug 293 may be formed through the upper insulation layer 275 to be in contact with the pad 240, the first connecting contact 248a and the second connecting contact 248b, respectively.

A bit line 285 may be formed on the upper insulation layer 275 to be electrically connected to the bit line contact 280. The bit line 285 may be extended in the third direction D3 and may be electrically connected to a plurality of the bit line contacts 280.

A connecting wiring 296 for connecting the first and second plugs 291 and 293 to each other may be formed on the upper insulation layer 275. An electrical signal or a voltage may be transferred from the transistor 103 and 130 to the first to third base layer patterns 201a, 201b and 201c through the connecting wiring 296.

For example, an upper conductive layer may be formed on the upper insulation layer 275 using a metal or a metal nitride, and then may be patterned to form the bit line 285 and the connecting wiring 294. The bit line 285 and the connecting wiring 296 may be formed from substantially the same etching process.

Figure 13:
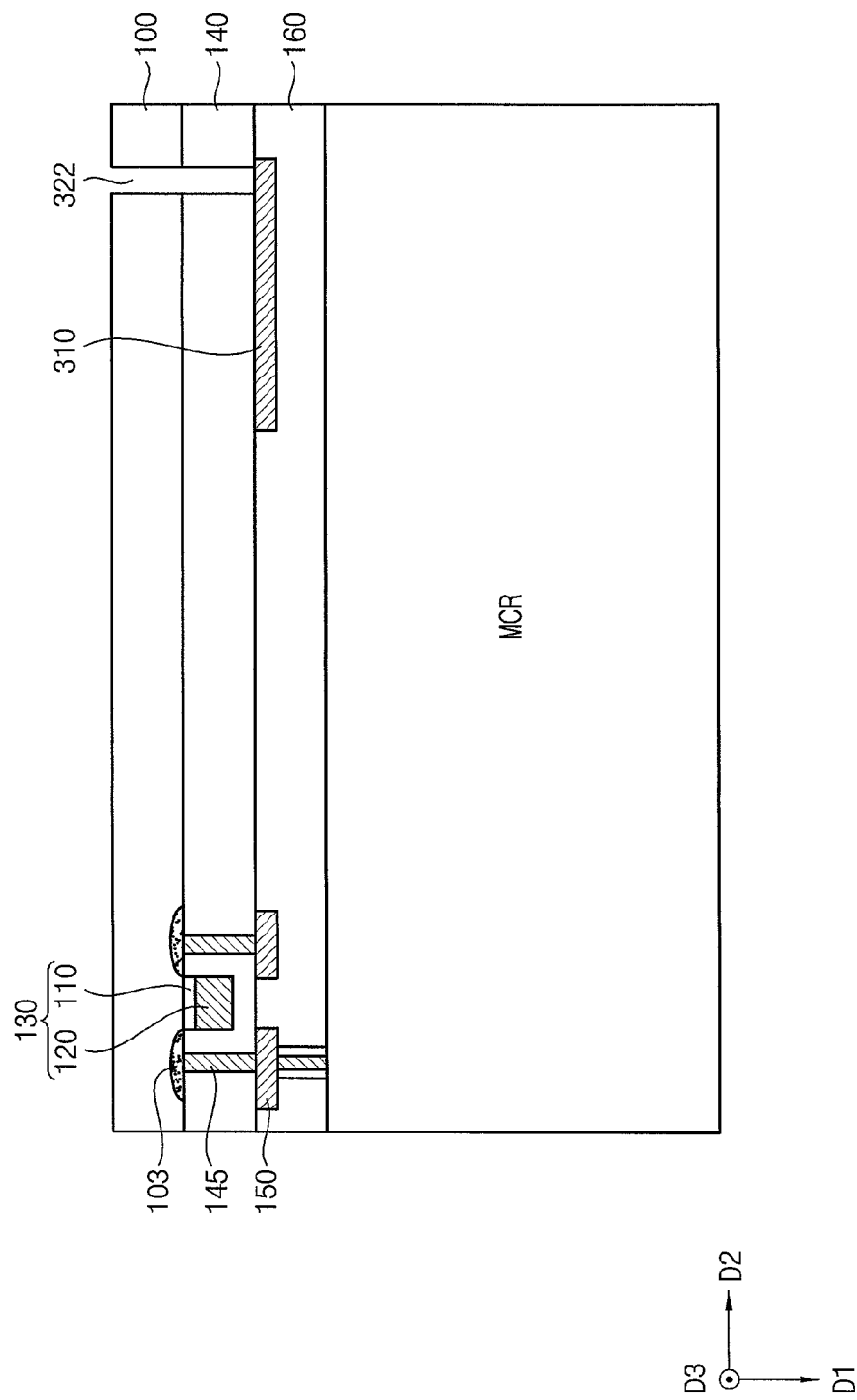
Figure 14:
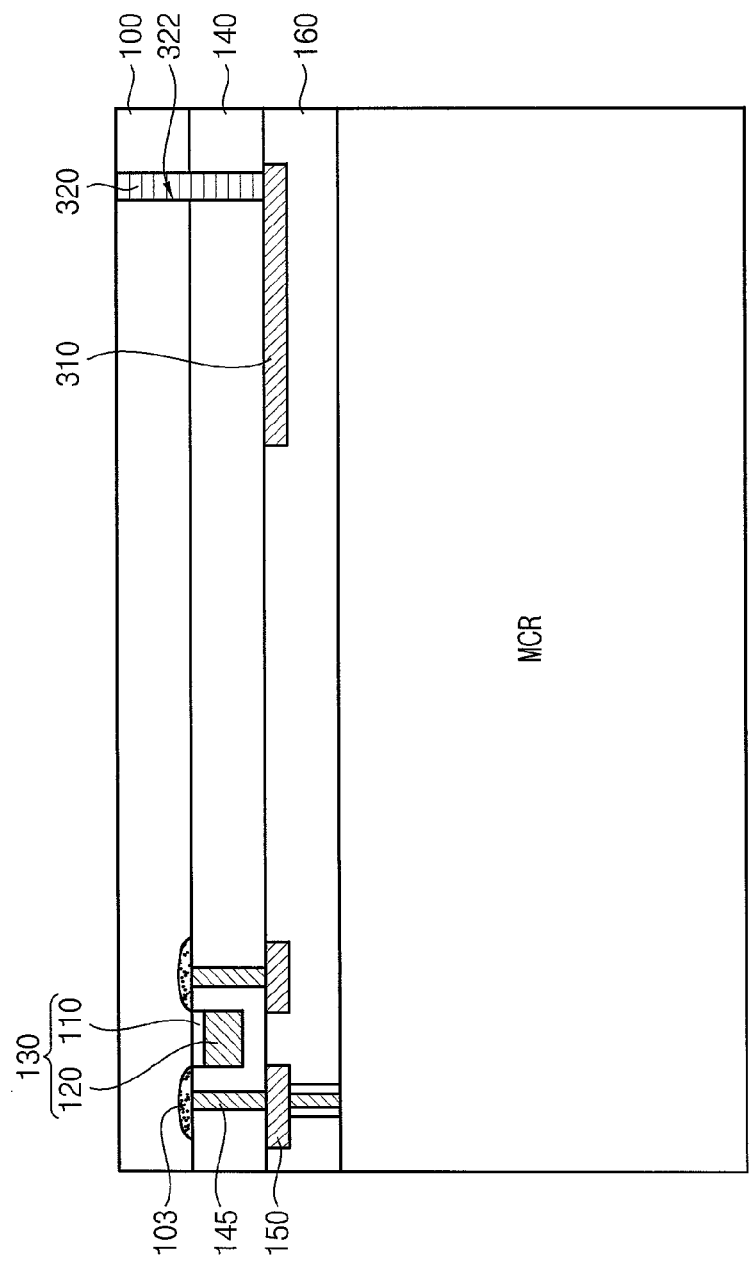

Referring to FIG. 13, after processes for the memory cell region MCR are completed, a trench 322 may be formed to penetrate the semiconductor substrate 100 and a portion 140 of the lower insulation layer 140 and 160. The trench 322 may overlap with a portion of the memory cell region MCR in the vertical direction D1. For example, the memory device may be turned upside down and a photoresist pattern may be formed on the bottom surface of the semiconductor substrate 100 to expose the portion for the trench 322. Using the photoresist pattern as a etch mask, the semiconductor substrate 100 and the lower insulation layer 140 may be etched to form the trench 322. In this case, the trench 322 corresponding to the through-substrate via may be formed using the lower wiring 310 as an etch stop layer Referring to FIG. 14, the through-substrate via 320 may be formed by filling the trench 322 with conductive material. In some example embodiments, an insulation layer and a barrier layer may be formed on the inner sidewall of the trench 322 and then a conductive may be formed on the barrier layer. For example, the insulation layer may include oxide such as silicon oxide and nitride such as silicon nitride, and the barrier layer may include metallic nitride such as titanium nitride, tantalum nitride, tungsten nitride, copper nitride, aluminum nitride, etc. The conductive layer may include metal such as copper, aluminum, tungsten, etc. or doped polysilicon. When copper or aluminum is used as the conductive layer, a seed layer may be formed on the barrier layer and then the conductive layer may be formed through galvanoplasty.

Referring to FIG. 15, the input-output pads 330 may be formed to cover the through-substrate via that is exposed from the bottom surface of the semiconductor substrate 100. The input-output pads 330 may include, e.g., nickel, copper, aluminum, alloy of tin and silver, etc. The through-substrate via 320 may connect the input-output pad 330 to the lower wiring 310 in the lower insulation layer 140 and 160. The input-output pad 330 and the through-substrate via 320 may overlap with a portion of the memory cell array in the memory cell region MCR in the vertical direction D1.

FIGS. 9 to 15 illustrate processes that the through-substrate via 320 is formed after forming the memory cell array, however, the process order is not be specifically limited herein. For example, the through-substrate vias 320 may be formed in advance and then the processes for the peripheral circuit region PCR and the memory cell region MCR may be performed. For another example, the processes for the peripheral circuit region PCR may be performed, the through-substrate vias may be performed and then the processes for the memory cell region MCR may be performed.

Figure 16:
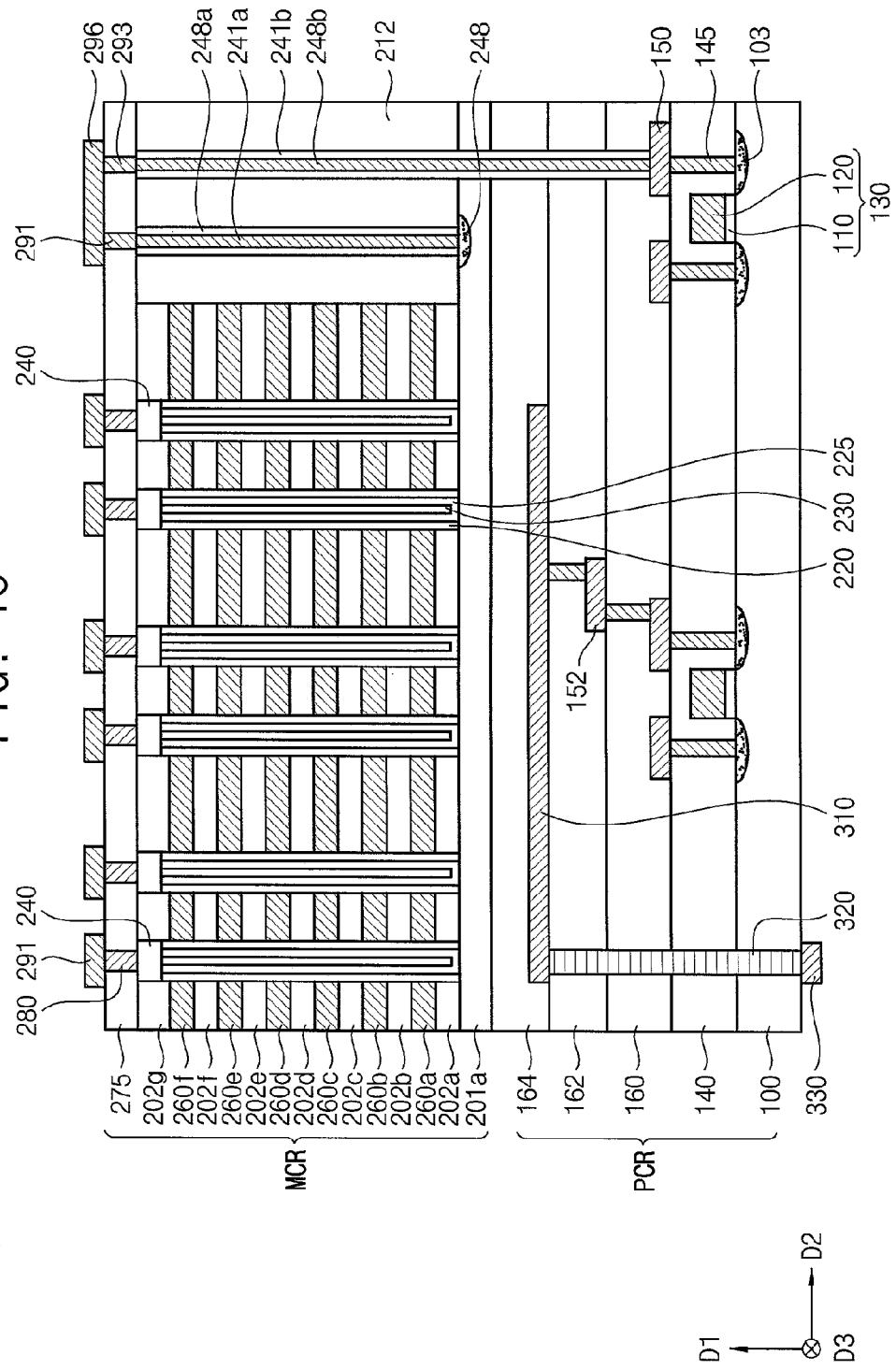
FIG. 16 is a cross-sectional view of a memory device according to example embodiments.

FIG. 16 is a cross-sectional view of a memory device according to example embodiments. The memory device of FIG. 16 is similar to that of FIGS. 4 to 7 and repeated descriptions are omitted.

Compared with the memory device of FIG. 6 that includes one lower wiring layer, the memory device of FIG. 16 includes a plurality of lower wiring layers. For example, a second lower insulation layer 160 may be formed on a first lower insulation layer 140 to cover the lower wiring 150, a third lower insulation layer 162 may be formed on the second lower insulation layer 160 to cover the lower wiring 152 and a fourth lower insulation layer may be formed on the third lower insulation pattern to cover the lower wiring 310. FIG. 16 illustrates that the through-substrate via 320 is connected to the lower wiring in the uppermost wiring layer, however, the connection is not be specifically limited herein. The through-substrate via 320 may be connected to the lower wiring in the various layers according to routing of signal lines.

Figure 17:
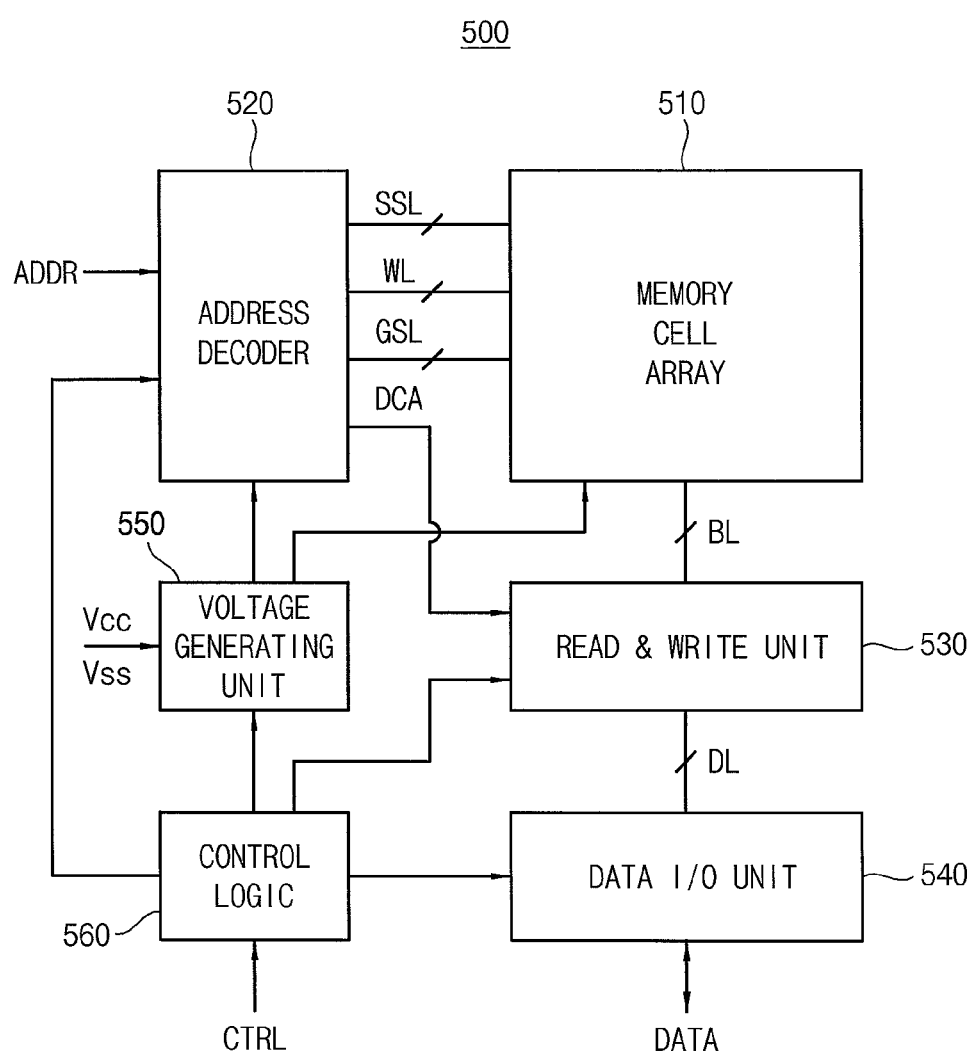
FIG. 17 is a block diagram illustrating a memory device according to example embodiments.

FIG. 17 is a block diagram illustrating a memory device according to example embodiments.

Referring to FIG. 17, a memory device 500 includes a memory cell array 510, an address decoder 520, a read & write unit 530, a data input/output (I/O) unit 540, a voltage generating unit 550, and a control logic 560.

According to example embodiments, the memory cell array 510 may be formed in the memory cell region MCR in FIG. 1 and the other elements 520, 530, 540, 550 and 560 may be formed in the peripheral circuit region PCR in FIG. 1.

The memory cell array 510 is connected to the address decoder 520 through word lines WL and selection lines. For example, the selection lines may include string selection lines SSL and ground selection lines GSL. The memory cell array 510 is connected to the read & write unit 530 through a bit line BL.

The memory cell array 510 may include a plurality of memory cells. For example, the memory cell array 510 includes memory cells disposed along row and column directions. For example, the memory cell array 510 includes a plurality of memory cells, each cell storing one or more data bits. The memory cell array may have a vertical NAND flash structure as illustrated in FIG. 8.

The address decoder 520 is connected to the memory cell array 510 through word lines WL, string selection lines SSL, and ground selection lines GSL. The address decoder 520 is configured to operate in response to a control of the control logic 560. The address decoder 520 receives addresses ADDR from an external device such as a memory controller.

The address decoder 520 is configured to decode a row address among the received addresses ADDR. The address decoder 520 is configured to select a word line corresponding to the decoded row address among the word lines WL. The address decoder 520 is configured to select selection lines corresponding to the decoded row address among the selection lines including string selection lines SSL and ground selection lines GSL.

The address decoder 520 is configured to deliver various voltages received from the voltage generating unit 550 to the selected word line, unselected word line, selected selection line, and unselected selection line.

The address decoder 520 is configured to decode a column address among the received address ADDR. The address decoder 520 delivers the decoded column address DCA to the read & write unit 530.

In an embodiment, the address decoder 520 may include a row decoder decoding a row address, a column decoder decoding a column address, and an address buffer storing a received address ADDR.

The read & write unit 530 is connected to the memory cell array 510 through bit lines BL, and is connected to the data I/O unit 540 through data lines DL. The read & write unit 530 operates in response to a control of the control logic 560. The read & write unit 530 receives a decoded column address DCA from the address decoder 520. Using the decoded column address DCA, the read & write unit 530 selects bit lines BL.

In an embodiment, the read & write unit 530 receives data from the data I/O unit 540, and writes received data in the memory cell array 510. The read & write unit 530 reads data from the memory cell array 510 and delivers the read data to the data I/O unit 540. The read & write unit 530 reads data from a first storage region of the memory cell array 510 and writes the read data in a second storage region of the memory cell array 510. For example, the read & write unit 530 performs a copy-back operation.

In an embodiment, the read & write unit 530 may include components such as a page buffer (or page register) and a column selection circuit. In an embodiment, the read & write unit 530 may include components such as a sense amplifier, a write driver, and a column selection circuit.

The data I/O unit 540 is connected to the read & write unit 530 through data lines DL. The data I/O unit 140 operates in response to a control of the control logic 560. The data I/O unit 540 is configured to exchange data DATA with the external. The data I/O unit 540 is configured to deliver data DATA from the external to the read & write unit 530 through data lines DL. The data I/O unit 540 is configured to output data DATA delivered from the read & write unit 530 through data lines DL to the external. In an embodiment, the data I/O unit 540 may include components such as a data buffer.

The voltage generating unit 550 is connected to the memory cell array 510, the address decoder 520, and the control logic 560. The voltage generating unit 550 receives power from the external. In an embodiment, the voltage generating unit 550 receives a power voltage Vcc and a ground voltage Vss from the external. In response to a control of the control logic 560, the voltage generating unit 550 is configured to generate voltages having various levels from the power voltage Vcc and the ground voltage Vss. In an embodiment, the voltage generating unit 550 is configured to generate various voltages such as a high voltage VPP, a program voltage Vpgm, a pass voltage Vpass, a read voltage Vread, and an erase voltage Vers.

Voltages generated by the voltage generating unit 550 are supplied to the address decoder 520 and the memory cell array 510 under a control of the control logic 560. For example, a program voltage Vpgm and a pass voltage Vpass may be supplied to the address decoder 520 during a program operation. During a read operation, a read voltage Vread may be supplied to the address decoder 520. During erasing the memory cell array 510, an erase voltage Vers may be supplied to the memory cell array 510.

Voltages generated by the voltage generating unit 550 are not limited to the above-mentioned voltages.

The control logic 560 is connected to the address decoder 520, the read & write unit 530, the pass/fail check unit 160, and the data I/O unit 540. The control logic 560 is configured to control general operations of the nonvolatile memory device 100*a*. The control logic 560 operates in response to a control signal CTRL delivered from the external device.

Figure 18:
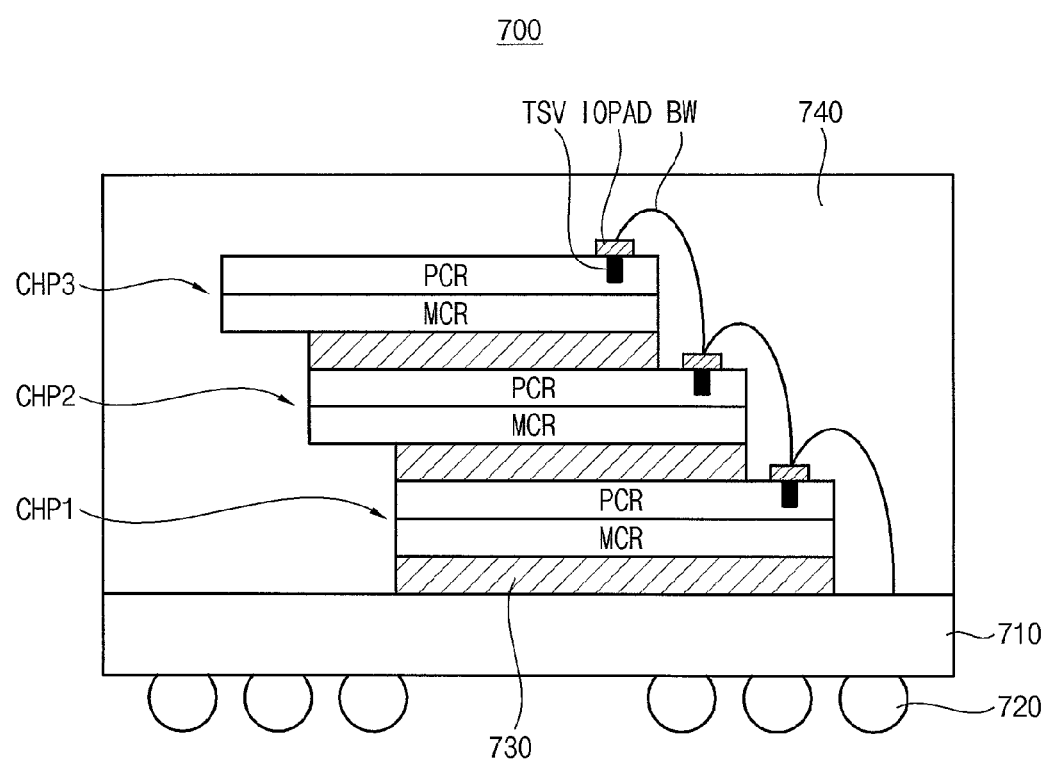
FIG. 18 is a diagram illustrating a memory package according to example embodiments.

FIG. 18 is a diagram illustrating a memory package according to example embodiments.

Referring to FIG. 18, a memory package 700 may include a base substrate 710 and a plurality of memory chips CHP1, CHP2 and CHP3 stacked on the base substrate 710. Each of the memory chips CHP1, CHP2 and CHP3 may include a peripheral circuit region PCR and a memory cell region MCR. The peripheral circuit region PCR may include a semiconductor substrate, a peripheral circuit formed on a top surface of the semiconductor substrate and a lower insulation layer covering the peripheral circuit. The memory cell region MCR may include a base layer formed on the lower insulation layer, a memory cell array formed on the base layer, an upper insulation layer covering the memory cell array. A plurality of input-output pads IOPAD may be formed on a bottom surface of each semiconductor substrate. The input-output pads IOPAD may cover through-substrate vias TSV formed in the peripheral circuit region PCR.

With respect to each of the memory chips CHP1, CHP2 and CHIP3, the plurality of input-output pads IOPAD overlap, in a vertical direction, with a portion of the memory cell region MCR where the memory cell array is formed.

As illustrated in FIG. 18, the memory chips CHP1, CHP2 and CHP3 are stacked on the base substrate 710 in an upside-down state such that the bottom surface of the semiconductor substrate of each memory chip faces upwards. In other words, with respect to each of the memory chips CHP1, CHP2 and CHIP3, the memory cell region MCR locates on the peripheral circuit region PCR.

With respect to each of the memory chips CHP1, CHP2 and CHIP3, the plurality of input-output pads IOPAD may be arranged near one side of the bottom surface of the semiconductor substrate. As such, the memory chips CHP1, CHP2 and CHP may be stacked scalariformly, that is, in a step shape, such that the plurality of input-output pads IOPAD of each memory chip may be exposed. In such stacked state, the memory chips CHP1, CHP2 and CHP3 may be electrically connected to the base substrate 710 through a plurality of bonding wires BW.

The stacked memory chips CHP1, CHP2 and CHP3 and the bonding wires BW may be fixed by sealing member 740 and adhesive member 739 may intervene between the base substrate 710 and the memory chips CH1, CH2 and CH3. Conductive bumps 720 may be formed on the bottom surface of the base substrate 710 for electrical connections to the external device.

As such, the memory chip and the memory package including the memory chip according to example embodiments may reduce sizes of the memory chip and the memory package by adopting the cell over periphery (COP) structure in which the peripheral circuit is formed on the semiconductor substrate and the memory cell array is stacked on the peripheral circuit. In addition, the memory chip and the memory package may further reduce the sizes of the memory device and the memory package by forming the input-output pads IOPAD such that the input-output pads IOPAD may overlap with the memory cell region MCR in the vertical direction D1.

Figure 19:
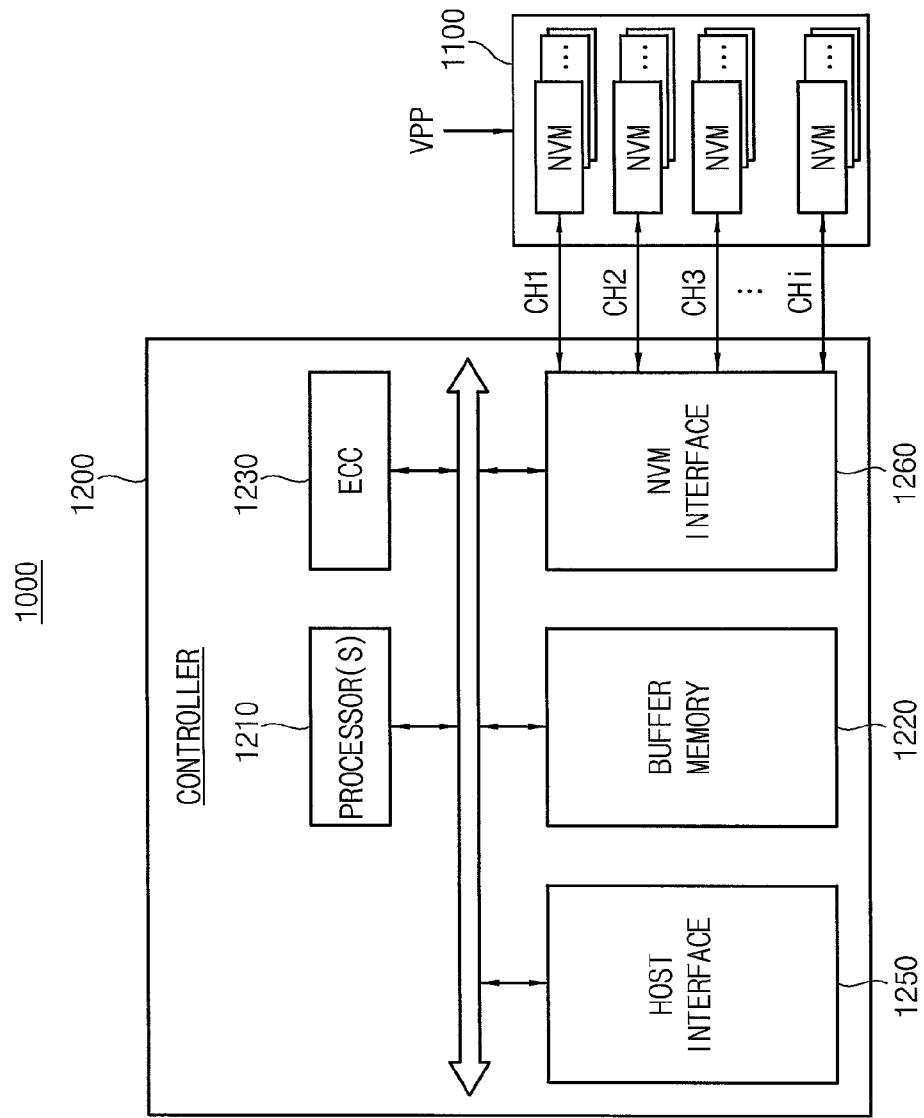
FIG. 19 is a block diagram illustrating a solid state disc or solid state drive (SSD) according to example embodiments.

FIG. 19 is a block diagram illustrating a solid state disc or solid state drive (SSD) according to example embodiments.

Referring to FIG. 19, SSD 1000 comprises multiple nonvolatile memory devices 1100 and an SSD controller 1200.

The nonvolatile memory devices 1100 may be optionally supplied with an external high voltage VPP. Each of the nonvolatile memory devices 1100 may include the above-described vertical NAND flash memory device. The nonvolatile memory devices 1100 may have the COP structure and the arrangement of the input-output pads according to example embodiments, as described with reference to FIGS. 1 to 17.

The SSD controller 1200 is connected to the nonvolatile memory devices 1100 through multiple channels CH1 to CHi. The SSD controller 1200 comprises one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. Although FIG. 19 illustrates an embodiment where the buffer memory 1220 is included in the SSD controller 1200, the inventive concept is not limited thereto. For example, the buffer memory 1220 may be placed outside the SSD controller 1200.

The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100. Although not shown in FIG. 19, a code memory may be further included to store code data needed to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

Figure 20:
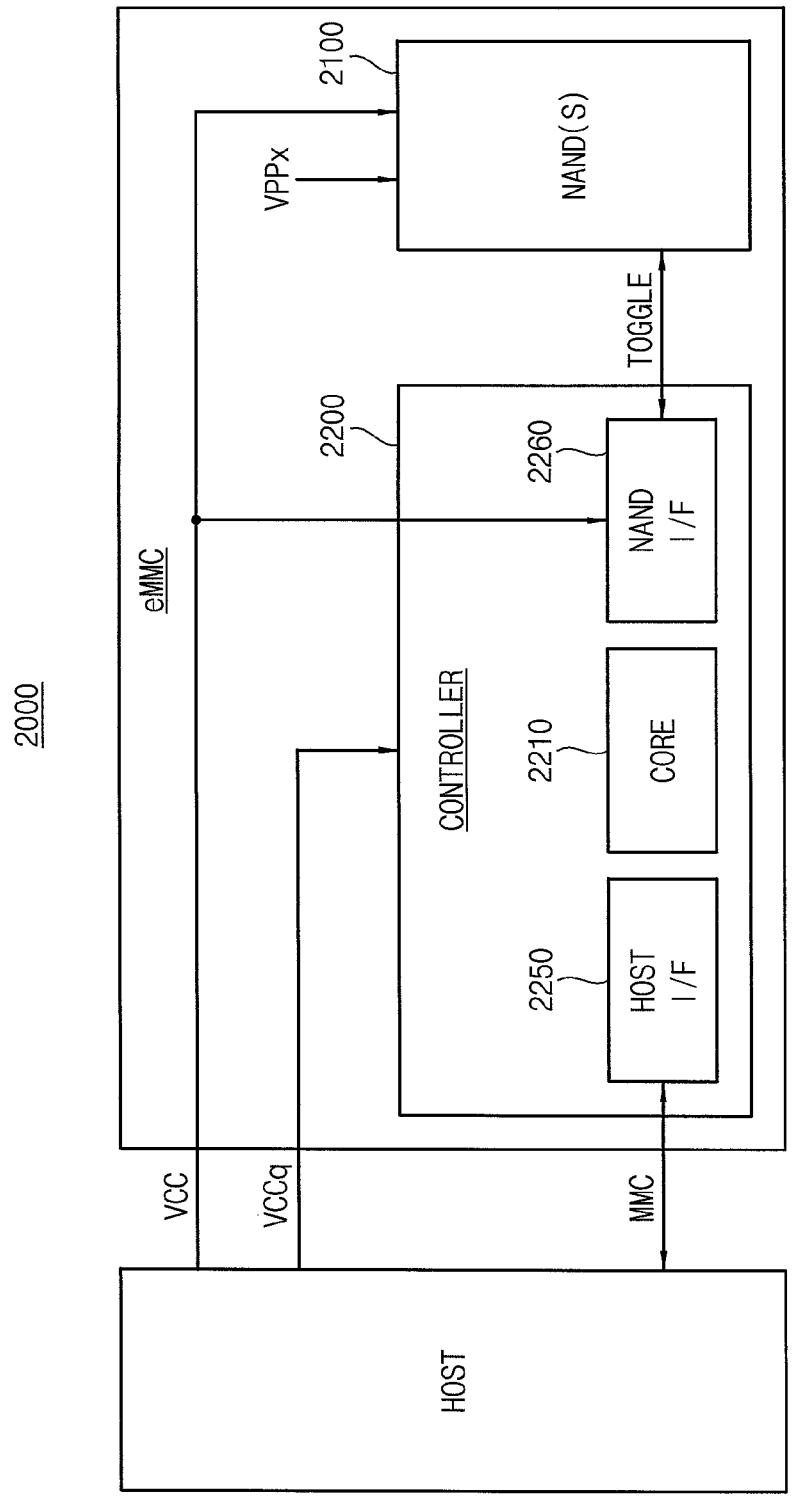
FIG. 20 is a block diagram illustrating an embedded multi-media card (eMMC) according to example embodiments.

FIG. 20 is a block diagram illustrating an embedded multi-media card (eMMC) according to example embodiments.

Referring to FIG. 20, an eMMC 2000 comprises one or more NAND flash memory devices 2100 and a controller 2200.

The NAND flash memory device 2100 may have the COP structure and the arrangement of the input-output pads according to example embodiments, as described with reference to FIGS. 1 to 17.

The controller 2200 is connected with the NAND flash memory device 2100 via multiple channels. The controller 2200 includes one or more controller cores 2210, a host interface 2250, and a NAND interface 2260. The controller core 2210 controls an overall operation of the eMMC 2000. The host interface 2250 is configured to perform an interface between the controller 2210 and a host. The NAND interface 2260 is configured to provide an interface between the NAND flash memory device 2100 and the controller 2200. In some example embodiments, the host interface 2250 may be a parallel interface (e.g., an MMC interface). In other example embodiments, the host interface 2250 of eMMC 2000 may be a serial interface (e.g., UHS-II, UFS, etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In some embodiments, eMMC 2000 may be optionally supplied with an external high voltage VPPx.

Figure 21:
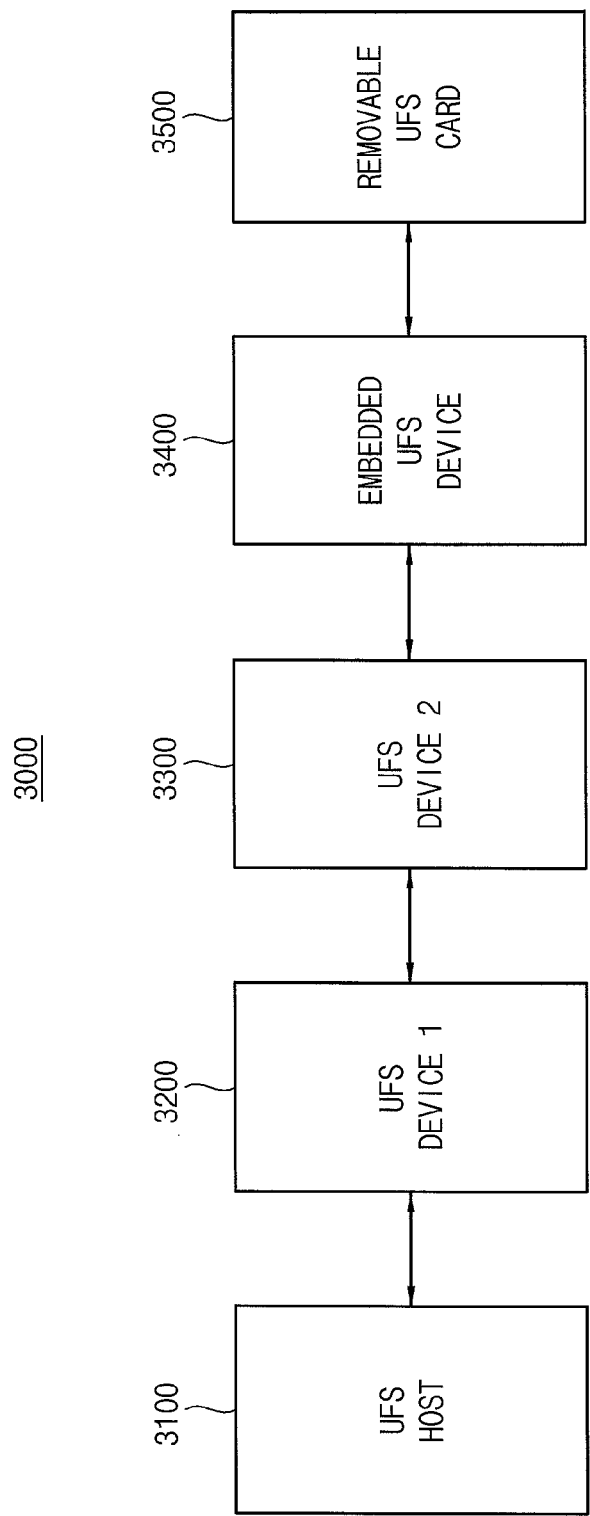
FIG. 21 is a block diagram illustrating a universal flash storage (UFS) according to example embodiments.

FIG. 21 is a block diagram illustrating a universal flash storage (UFS) according to example embodiments.

Referring to FIG. 21, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by a nonvolatile memory device. The nonvolatile memory device may have the COP structure and the arrangement of the input-output pads according to example embodiments, as described with reference to FIGS. 1 to 17.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Figure 22:
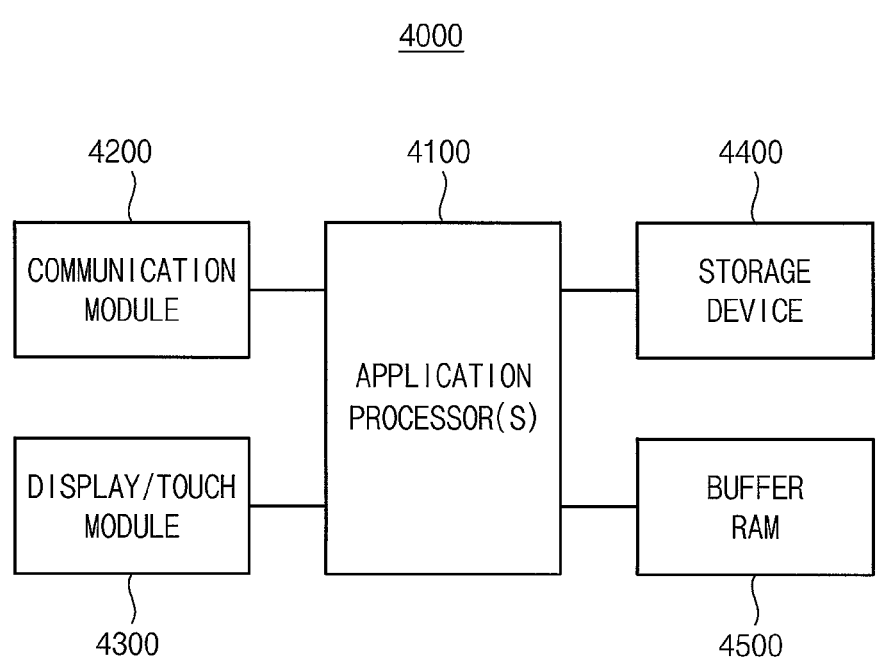
FIG. 22 is a block diagram illustrating a mobile device according to example embodiments.

FIG. 22 is a block diagram illustrating a mobile device according to example embodiments.

Referring to FIG. 22, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be eMMC, SSD, UFS device, etc. The storage device 4400 may include a nonvolatile memory device. The nonvolatile memory device may have the COP structure and the arrangement of the input-output pads according to example embodiments, as described with reference to FIGS. 1 to 17.

The mobile RAM 4500 temporarily stores data used for processing operations of the mobile device 4000.

It may be beneficial to implement a small-sized mobile device 4000 by improving the degree of freedom on lines to improve a layout.

A memory device or a storage device according to an embodiment of the inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

As described above, the memory device, the memory package including the memory device and the method of manufacturing the memory device may reduce sizes of the memory device and the memory package by adopting the COP structure in which the peripheral circuit is formed on the semiconductor substrate and the memory cell array is stacked on the peripheral circuit. In addition, the memory device, the memory package including the memory device and the method of manufacturing the memory device may reduce the sizes of the memory device and the memory package by forming the input-output pads that overlap with the memory cell region in the vertical direction.

The present disclosure may be applied to various devices and systems. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A memory device comprising:
a semiconductor substrate having a top surface and a bottom surface;
a peripheral circuit formed on the top surface of the semiconductor substrate;
a lower insulation layer covering the peripheral circuit;
a base layer formed on the lower insulation layer;
a memory cell array formed on the base layer;
an upper insulation layer covering the memory cell array;
a plurality of input-output pads formed on the bottom surface of the semiconductor substrate, wherein at least one of the plurality of input-output pads is disposed to be overlapped with a portion of the memory cell array in a vertical direction, and wherein the memory cell array includes a plurality of vertical NAND flash memory cells; and
a plurality of through-substrate vias penetrating the semiconductor substrate and a portion of the lower insulation layer configured to connect the input-output pads with input-output pad of another semiconductor memory device.

2. The memory device of claim 1,
wherein the memory cell array includes:
a plurality of channels extending in the vertical direction; and
a plurality of gate lines surrounding outer sidewalls of the channels,
wherein the gate lines are stacked in the vertical direction and spaced apart from each other, and
wherein at least one of the plurality of input-output pads is disposed to be overlapped with at least one of the plurality of channels of the memory cell array in the vertical direction.

3. The memory device of claim 1, wherein at least one of the through-substrate vias is disposed to be overlapped with the portion of the memory cell array in the vertical direction.

4. The memory device of claim 1, wherein the plurality of input-output pads are arranged near one side of the semiconductor substrate.

5. The memory device of claim 1, wherein the plurality of through-substrate vias connect the plurality of input-output pads with a plurality of lower wiring patterns in the lower insulation layer.

6. The memory device of claim 5, wherein the plurality of through-substrate vias are formed using the plurality of lower wiring patterns as an etch stop layer, after the plurality of lower wiring patterns are formed.

7. The memory device of claim 1, wherein the base layer includes polysilicon or single crystalline silicon.

8. The memory device of claim 7, wherein the base layer is divided into a plurality of base layer patterns and each of the plurality of base layer patterns serves as a p-type well.

9. A memory package comprising:
a base substrate; and
a plurality of memory chips stacked on the base substrate, each of the plurality of memory chips comprising:
a semiconductor substrate having a top surface and a bottom surface;
a peripheral circuit formed on the top surface of the semiconductor substrate;
a lower insulation layer covering the peripheral circuit;
a base layer formed on the lower insulation layer;
a memory cell array formed on the base layer;
an upper insulation layer covering the memory cell array; and
a plurality of input-output pads formed on the bottom surface of the semiconductor substrate,
wherein the memory cell array includes:
a plurality of channels extending in a vertical direction; and
a plurality of gate lines surrounding outer sidewalls of the plurality of channels, the plurality of gate lines being stacked in the vertical direction and spaced apart from each other, and wherein at least one of the plurality of input-output pads is disposed to be overlapped with at least one of the plurality of channels of the memory cell array in the vertical direction.

10. The memory package of claim 9,
wherein the plurality of memory chips are stacked on the base substrate in an upside-down state such that the bottom surface of the semiconductor substrate of each of the plurality of memory chips faces upwards.

11. The memory package of claim 10,
wherein, with respect to each memory chip, the plurality of input-output pads are arranged near one side of the bottom surface of the semiconductor substrate.

12. The memory package of claim 11,
wherein the plurality of memory chips are stacked in a step shape such that the plurality of input-output pads of each memory chip are exposed.

13. The memory package of claim 12, wherein the plurality of memory chips are electrically connected to the base substrate through a plurality of bonding wires.

* * * * *